(12) United States Patent
Park et al.

(10) Patent No.: US 12,317,598 B2
(45) Date of Patent: May 27, 2025

(54) DISPLAY DEVICE WITH SINGLE SIDE DRIVING STRUCTURE

(71) Applicant: Samsung Display Co., LTD., Yongin-si (KR)

(72) Inventors: Do Yeong Park, Yongin-si (KR); Kyung Bae Kim, Yongin-si (KR); Jong Woong Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/194,808

(22) Filed: Apr. 3, 2023

(65) Prior Publication Data

US 2024/0088163 A1    Mar. 14, 2024

(30) Foreign Application Priority Data

Sep. 14, 2022  (KR) .......................... 10-2022-0115894

(51) Int. Cl.
*H01L 27/12*    (2006.01)
*G09G 3/32*    (2016.01)
(Continued)

(52) U.S. Cl.
CPC .............. *H10D 86/60* (2025.01); *G09G 3/32* (2013.01); *H01L 25/167* (2013.01); *H10D 86/0231* (2025.01); *H10D 86/441* (2025.01); *G09G 2300/0413* (2013.01); *G09G 2300/0426* (2013.01); *G09G 2300/0842* (2013.01); *G09G 2310/0202* (2013.01)

(58) Field of Classification Search
CPC .............. G09G 3/32; G09G 2300/0412; G09G 2300/0426; G09G 2310/0202; G09G 2320/045; H01L 27/124; H01L 25/167
See application file for complete search history.

(56) References Cited

U.S. PATENT DOCUMENTS

| | | | |
|---|---|---|---|
| 10,249,603 B2 | 4/2019 | Cho et al. |
| 10,276,630 B2 | 4/2019 | Lee et al. |
| (Continued) | | |

FOREIGN PATENT DOCUMENTS

| | | |
|---|---|---|
| KR | 10-2018-0009014 | 1/2018 |
| KR | 10-2018-0011404 | 2/2018 |
| (Continued) | | |

*Primary Examiner* — Liliana Cerullo
(74) *Attorney, Agent, or Firm* — KILE PARK REED & HOUTTEMAN PLLC

(57) ABSTRACT

A display device includes a pixel component including scan lines, data lines, and pixels electrically connected to the scan lines and the data lines, and defining pixel columns and pixel rows, a data driver disposed on a side of the pixel component, and a scan driver disposed on the side of the pixel component. The pixel component includes sub-scan lines, and dummy lines. Each scan line may be electrically connected to the sub-scan lines by contacts. The contacts are divided into contact groups having a same arrangement. The pixel component is divided into pixel blocks corresponding to the contact groups. Each pixel block includes first and second area divided by contact group. The first area is closer to the scan driver than the second area. The pixel component further includes supplementary power lines spaced apart from the respective sub-scan lines.

13 Claims, 23 Drawing Sheets

(51) Int. Cl.
*H01L 25/16* (2023.01)
*H10D 86/01* (2025.01)
*H10D 86/40* (2025.01)
*H10D 86/60* (2025.01)

(56) References Cited

U.S. PATENT DOCUMENTS

| | | | |
|---|---|---|---|
| 10,340,419 B2 | 7/2019 | Kim et al. | |
| 2017/0294172 A1* | 10/2017 | Yang | G06F 3/0446 |
| 2019/0073976 A1* | 3/2019 | Yeh | G09G 3/3666 |
| 2022/0076636 A1* | 3/2022 | Sohn | G09G 3/3266 |
| 2022/0077111 A1 | 3/2022 | Shin et al. | |
| 2022/0199677 A1 | 6/2022 | Park et al. | |

FOREIGN PATENT DOCUMENTS

| | | |
|---|---|---|
| KR | 10-1987196 | 6/2019 |
| KR | 10-2022-0034271 | 3/2022 |

\* cited by examiner

CE1: CE1a, CE1b, CE1c

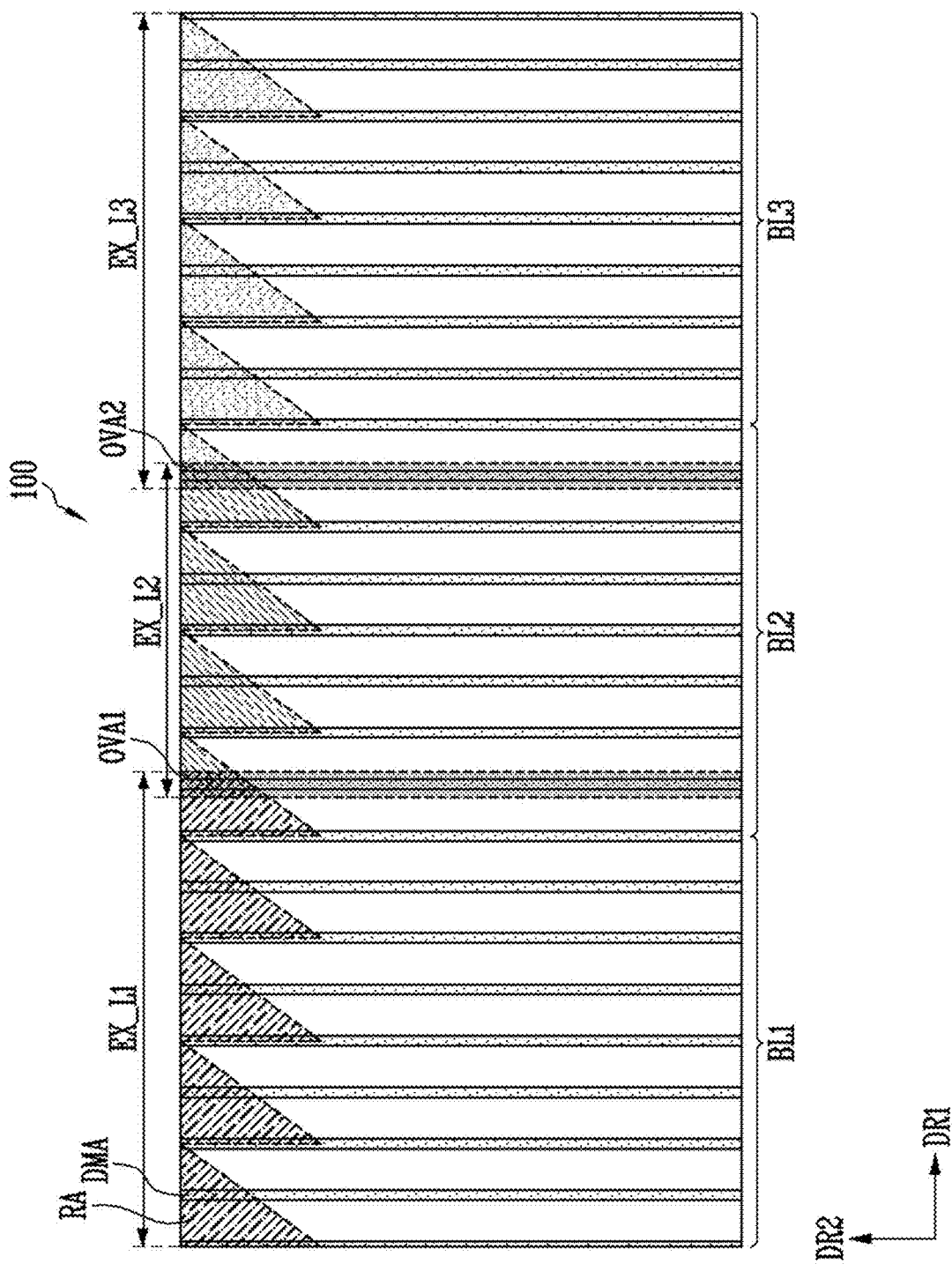

DISPLAY DEVICE WITH SINGLE SIDE DRIVING STRUCTURE

CROSS-REFERENCE TO RELATED APPLICATION(S)

This application claims priority to and benefits of Korean patent application 10-2022-0115894 under 35 U.S.C. § 119, filed on Sep. 14, 2022, in the Korean Intellectual Property Office (KIPO), the entire contents of which are incorporated herein by reference.

BACKGROUND

1. Technical Field

The disclosure relates to a display device and a method of fabricating the display device.

2. Description of Related Art

Recently, as interest in information display increases, research and development on display devices have been continuously conducted.

SUMMARY

Various embodiments of the disclosure are directed to a display device which has a single side driving structure and includes pixels blocks which respectively include residual areas having the same pattern.

Furthermore, various embodiments of the disclosure are directed to a method of fabricating the display device in which a bottom metal layer is patterned to include overlap areas by performing multiple exposure operations.

However, objects of the disclosure are not limited to the above-described objects, and various modifications are possible without departing from the spirit and scope of the disclosure.

In an embodiment of the disclosure, a display device may include a pixel component including scan lines extending in a first direction, data lines extending in a second direction, and pixels electrically connected to the scan lines and the data lines, and defining pixel columns and pixel rows, a data driver disposed on a side of the pixel component and electrically connected to the data lines, and a scan driver disposed on the side of the pixel component and electrically connected to the scan lines. The pixel component may include sub-scan lines extending from the scan driver in the second direction, and dummy lines extending in the second direction. Each of the scan lines may be electrically connected to the sub-scan lines in a ratio of 1:n (where n is an integer greater than 1) by contacts. The contacts may be divided into contact groups, the contacts in each of the contact groups arranged colinearly in a diagonal direction with respect to the first direction. The pixel component may be divided into pixel blocks corresponding to respective contact groups. Each of the pixel blocks may include a first area and a second area divided by a corresponding one of the contact groups. In a pixel column, the first area may be closer to the scan driver than the second area. The pixel component may further include, in the second area, supplementary power lines spaced apart from a corresponding one of the sub-scan lines in the second direction.

In an embodiment, the pixel component may further include first power lines providing a voltage of a first power supply to the pixels, and extending in the second direction, and second power lines providing a voltage of a second power supply to the pixels, and extending in the second direction. The first power lines and the second power lines may be spaced apart from the sub-scan lines and the dummy lines in the first direction.

In an embodiment, two adjacent ones of the supplementary power lines may be electrically connected to each other in the second area.

In an embodiment, the two supplementary power lines electrically connected to each other may be electrically connected to an adjacent one of the first power lines in the second area.

In an embodiment, the two supplementary power lines electrically connected to each other may be electrically connected to an adjacent one of the second power lines in the second area.

In an embodiment, the second area may include residual areas having an identical arrangement structure of the sub-scan lines, the first power lines, the second power lines, the dummy lines, the data lines, and the supplementary power lines. The residual areas may be arranged in the first direction.

In an embodiment, a number of the residual areas in each of the pixel blocks may be same.

In an embodiment, each of the residual areas may include disconnected portions disposed between the sub-scan lines and the supplementary power lines. The disconnected portions may be arranged in the diagonal direction.

In an embodiment, in each of the residual areas, lengths of the supplementary power lines in the second direction may decrease in the first direction.

In an embodiment, some of the pixel columns may overlap the dummy lines in a plan view, and rest of the pixel columns may overlap the sub-scan lines in a plan view.

In an embodiment, the pixel columns may include a first pixel column and a second pixel column. The first pixel column may overlap two dummy lines adjacent to each other in a plan view, and the second pixel column may overlap two sub-scan lines adjacent to each other in a plan view.

In an embodiment, the scan lines may include a first scan line and a second scan line adjacent to each other. One of the two sub-scan lines adjacent to each other may be electrically connected to the first scan line. Another one of the two sub-scan lines adjacent to each other may be connected to the second scan line.

In an embodiment, the sub-scan lines, the first power lines, the second power lines, the dummy lines, the data lines, and the supplementary power lines may be disposed on a same layer.

In an embodiment of the disclosure, a method of fabricating a display device may include patterning a first exposure area of a bottom metal layer disposed on a substrate using a first portion of a mask including residual area patterns identical to each other, patterning a second exposure area overlapping a portion of the first exposure area of the bottom metal layer in a plan view using a second portion of the mask, and patterning a third exposure area overlapping a portion of the second exposure area of the bottom metal layer in a plan view using a third portion of the mask. The bottom metal layer after the patterning of the third exposure area may include data lines, sub-scan lines, dummy lines, first power lines, second power lines, and supplementary power lines that extend in a pixel column direction.

In an embodiment, the method may further include successively forming a gate layer and an insulating layer on the bottom metal layer, forming contacts by etching the insulating layer, and patterning a top metal layer on the insulating layer. The top metal layer may include scan lines, each of the scan lines may be electrically connected to the sub-scan lines in a ratio of 1:n (where n is an integer greater than 1) by contacts and may extend in a pixel row direction. The contacts may be divided into contact groups, the contacts in each of the contact groups arranged colinearly in a diagonal direction with respect to the pixel row direction.

In an embodiment, each of a length of the first exposure area in the pixel row direction and a length of the third exposure area in the pixel row direction may be greater than a length of the second exposure area in the pixel row direction.

In an embodiment, a residual area of the bottom metal layer corresponding to the residual area patterns may include disconnected portions between the sub-scan lines and the supplementary power lines. The disconnected portions in the residual area may be arranged in the diagonal direction.

In an embodiment, the sub-scan lines in each pixel column may be spaced apart from the supplementary power lines in the pixel column direction.

In an embodiment, two adjacent ones of the supplementary power lines may be electrically connected to an adjacent one of the first power lines.

In an embodiment, two adjacent ones of the supplementary power lines may be electrically connected to an adjacent one of the second power lines.

A display device having a single side driving structure and a method of fabricating the display device in accordance with an embodiment of the disclosure may include a pattern of a bottom metal layer of residual areas which are repeatedly arranged in a second area of each of pixel blocks. Therefore, the lengths of unnecessary portions of sub-scan lines may be reduced, and an IR drop of a scan signal may be mitigated. Residual lines separated from each other by a disconnected portion may be electrically connected to a first power line or a second power line as supplementary power lines, so that an IR drop of a power voltage may be mitigated, the power consumption may be reduced, and the image quality, which is affected by factors such as a luminance deviation, may be improved.

A patterning operation for the bottom metal layer may be performed with overlap areas such that multiple residual areas having a same pattern are formed in each of the pixel blocks, whereby a number of times exposure operations are performed may be minimized. Therefore, stitch spots may be minimized or prevented from occurring.

However, effects of the disclosure are not limited to the above-described effects, and various modifications are possible without departing from the spirit and scope of the disclosure.

BRIEF DESCRIPTION OF THE DRAWINGS

FIGS. 18A, 18B, 19A, 19B, 20A, and 20B are schematic diagrams for describing a method of fabricating a display device in accordance with embodiments of the disclosure.

DETAILED DESCRIPTION OF EMBODIMENTS

Figure 1:
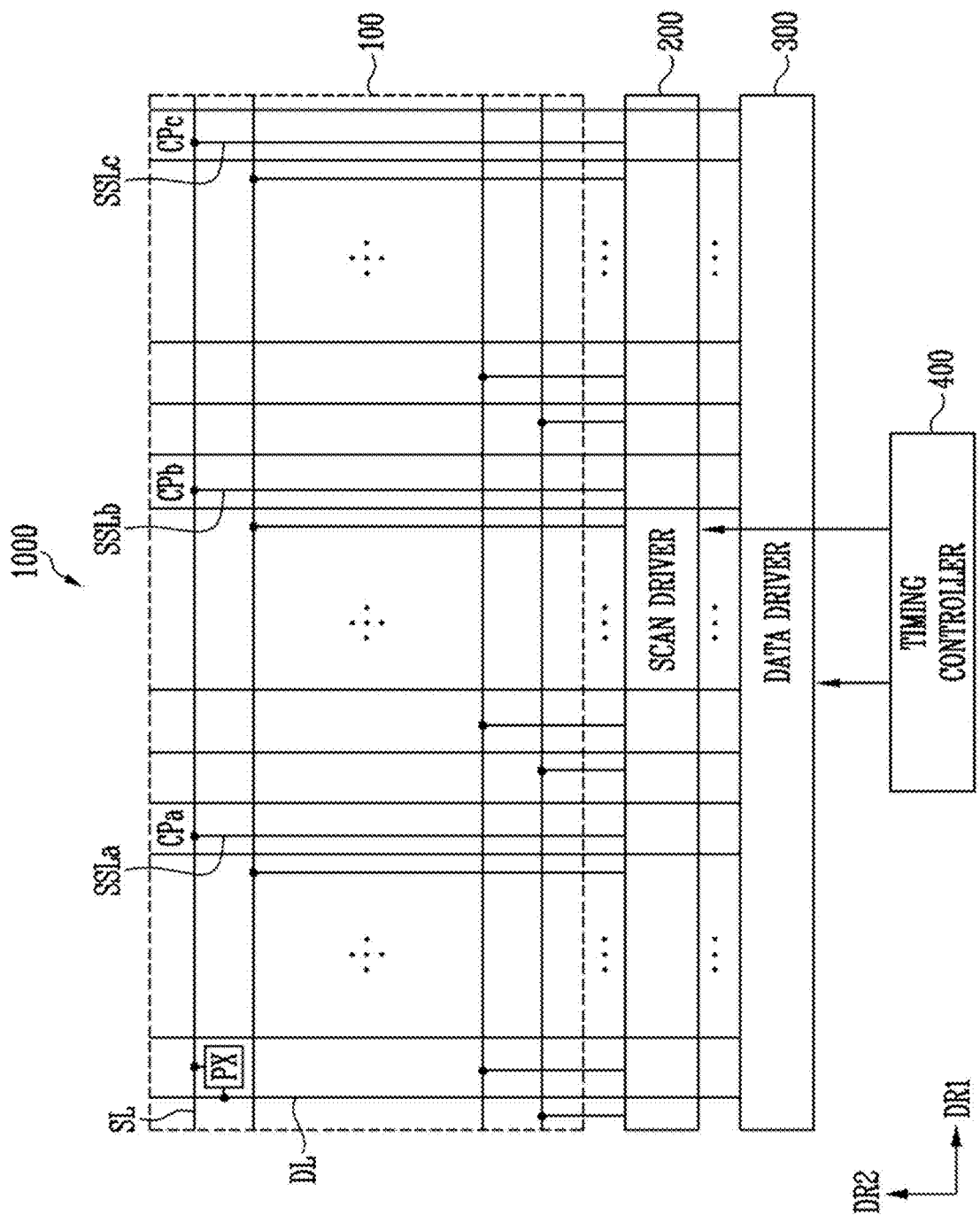
FIG. 1 is a schematic diagram illustrating a display device in accordance with embodiments of the disclosure.

Various embodiments of the disclosure will hereinafter be described in detail with reference to the accompanying drawings. The same reference numerals are used throughout the different drawings to designate the same components, and repetitive description of the same components will be omitted.

Embodiments described in this specification are made to clearly explain the scope of the disclosure to those having ordinary skill in the art, and do not intend to limit the disclosure. It should be interpreted that the disclosure may include substitutions and modifications within the technical scope of the disclosure.

The accompanying drawings are to facilitate the explanation of the disclosure and the shape in the drawings may be exaggerated for the purpose of convenience of explanation, so the disclosure should not be limited to the drawings.

If in the specification, detailed descriptions of well-known functions or configurations would unnecessarily obfuscate the gist of the disclosure, the detailed descriptions will be omitted.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element.

In the specification and the claims, the phrase "at least one of" is intended to include the meaning of "at least one selected from the group of" for the purpose of its meaning and interpretation. For example, "at least one of A and B" may be understood to mean "A, B, or A and B." In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

FIG. 1 is a schematic block diagram illustrating a display device in accordance with embodiments of the disclosure.

Referring to FIG. 1, the display device 1000 may include a pixel component 100, a scan driver 200, a data driver 300, and a timing controller 400.

The display device 1000 may be implemented as a self-emissive display device including multiple self-emissive elements. For example, the display device 1000 may be an organic emission display device including organic light emitting elements, a display device including inorganic light emitting elements, or a display device including light emitting elements formed of a combination of inorganic material and organic material. However, the disclosure is not limited thereto, and the display device 1000 may be implemented as a liquid crystal display device, a plasma display device, a quantum dot display device, or the like.

The display device 1000 may be a flat display device, a flexible display device, a curved display device, a foldable display device, or a bendable display device. The display device 1000 may be applied to a transparent display device, a head-mounted display device, a wearable display device, or the like.

The pixel component 100 may include pixels PX connected to scan lines SL and data lines DL. The display device 1000 in accordance with an embodiment may be a display device 1000 having a single side driving structure in which both the data driver 300 and the scan driver 200 are disposed on a side of the pixel component 100. In an embodiment, to apply the singe side driving structure, contacts CPa, CPb, and CPc of each of the scan lines SL may be respectively connected to a first sub-scan line SSLa, a second sub-scan line SSLb, and a third sub-scan line SSLc.

The pixel component 100 may be divided into a first pixel block, a second pixel block, and a third pixel block, based on an area where the first sub-scan line SSLa, the second sub-scan line SSLb, and the third sub-scan line SSLc are disposed. For example, the first sub-scan lines SSLa may be disposed in the first pixel block. The second sub-scan lines SSLb may be disposed in the second pixel block. The third sub-scan lines SSLc may be disposed in the third pixel block.

Although FIG. 1 illustrates that each of the scan lines SL is connected to three sub-scan lines SSLa, SSLb, and SSLc (i.e., at a ratio of 1:3), the disclosure is not limited thereto. For example, the scan line SL may be connected to the sub-scan lines in a ratio of 1:n (where n is an integer greater than 1). For example, the scan line SL may be connected to two sub-scan lines or four or more sub-scan lines.

The scan line SL may extend in a first direction DR1 (e.g., in a pixel row direction or a horizontal direction), and may be connected to the pixels PX of a corresponding pixel row. Each of the scan lines SL may define a pixel row.

The first sub-scan line SSLa may extend in a second direction DR2, and may be connected to the scan line SL on the first contact CPa. For example, the second direction DR2 may correspond to a pixel column direction. The first sub-scan line SSLa may electrically connect the scan driver 200 to the scan line SL.

In case that a single sub-scan line is connected to the scan line SL, an RC load (an RC delay) deviation may vary depending on a distance from the contact (e.g., CPa). To reduce such an RC load deviation, the scan line SL may be connected to multiple sub-scan lines SSLa, SSLb, and SSLc spaced apart from each other.

The second sub-scan line SSLb may extend in the second direction DR2, and may be connected to the scan line SL on the second contact CPb. The second sub-scan line SSLb may electrically connect the scan driver 200 to the scan line SL.

The third sub-scan line SSLc may extend in the second direction DR2, and may be connected to the scan line SL on the third contact CPc. The third sub-scan line SSLc may electrically connect the scan driver 200 to the scan line SL.

In an embodiment, as illustrated in FIG. 1, the first to third sub-scan lines SSLa, SSLb, and SSLc may be arranged such that the lengths thereof are gradually increased in the direction DR1.

The data lines DL may be connected to the pixels PX on a pixel column basis.

The scan driver 200 may receive a clock signal, a scan start signal, and the like from the timing controller 400, and supply scan signals to the scan lines SL. For example, the scan driver 200 may sequentially supply, to the first sub-scan lines SSLa, first output signals for supplying scan signals to the scan lines SL. The scan driver 200 may sequentially supply, to the second sub-scan lines SSLb, second output signals for supplying scan signals to the scan lines SL. The scan driver 200 may sequentially supply, to the third sub-scan lines SSLc, third output signals for supplying scan signals to the scan lines SL.

The first to third output signals each may be set to a gate-on level (a low voltage or a high voltage) corresponding to the type of transistor to which a scan signal is to be supplied. In other words, the first to third output signals may be generated and supplied as scan signals.

The data driver 300 may generate data signals based on image data supplied from the timing controller 400, and supply the data signals to the data lines DL. The data driver 300 may apply analog data signals (data voltages) corresponding to digital image data to the data lines DL on a pixel row basis. In an embodiment, the data driver 300 may include multiple data driving circuits for driving the data lines DL corresponding to certain areas of the pixel component 100.

The timing controller 400 may receive input image data from an image source such as an external graphic device. The timing controller 400 may generate image data corresponding to operation conditions of the pixel component 100 based on the input image data, and provide the image data to the data driver 300. Furthermore, the timing controller 400 may generate control signals for controlling the scan driver 200 and the data driver 300 to meet the operation conditions of the pixel component 100, and may provide the control signals to the scan driver 200 and the data driver 300, respectively.

In an embodiment, at least some of functions of the scan driver 200, the data driver 300, and the timing controller 400 may be integrated into a single driving chip and/or driving circuit. The driving chip and/or driving circuit may drive some areas of the pixel component 100, and the display device may include multiple driving chips and/or driving circuits.

Figure 2:
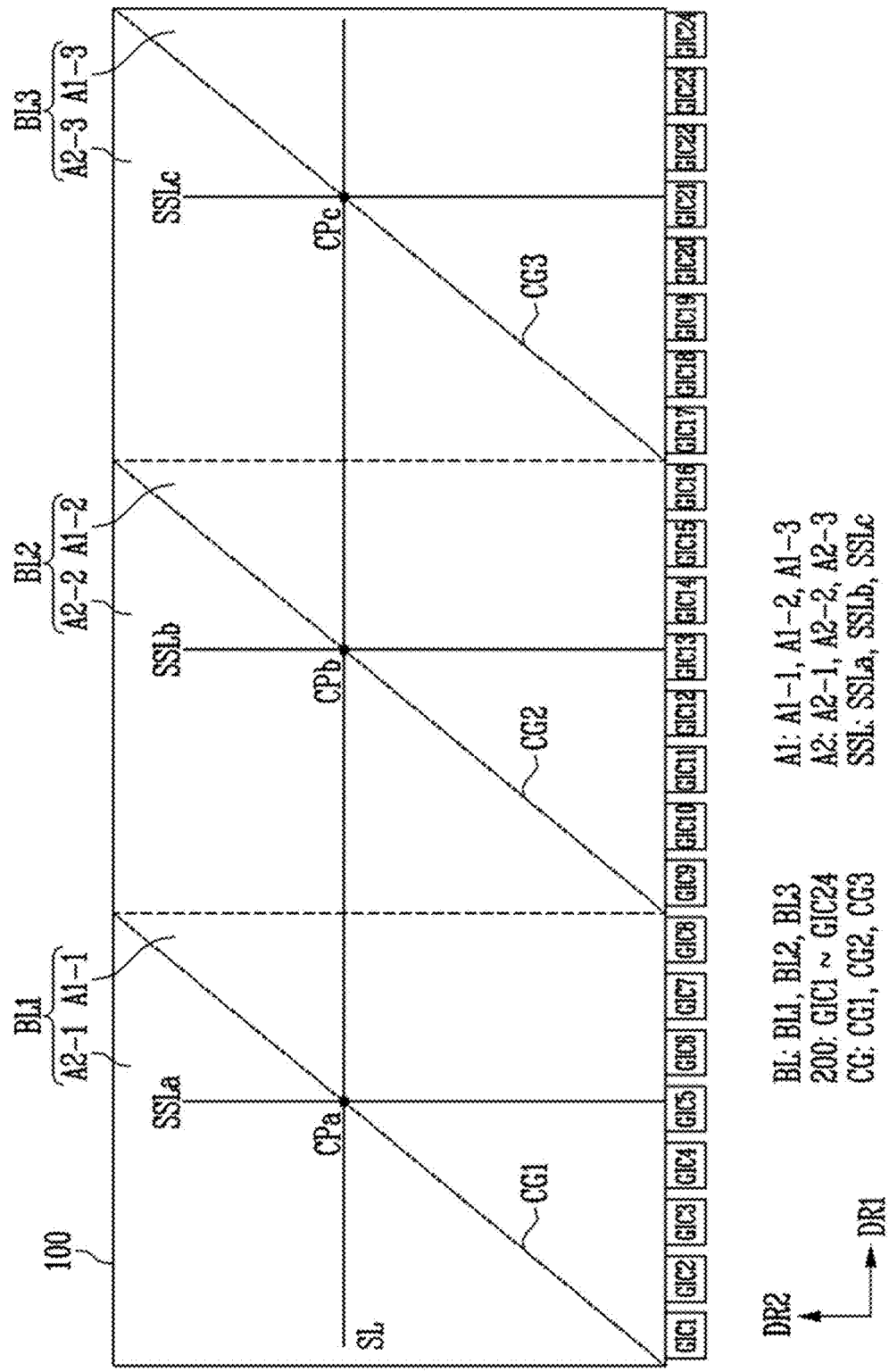
FIG. 2 is a schematic diagram illustrating the display device of FIG. 1 in accordance with embodiments of the disclosure.

FIG. 2 is a schematic diagram illustrating the display device of FIG. 1 in accordance with embodiments of the disclosure.

In FIG. 2, for convenience of explanation, illustration of the data driver 300, the timing controller 400, the pixel PX, and various signal lines will be omitted.

Referring to FIGS. 1 and 2, the pixel component 100 may be divided into first, second, and third pixel blocks BL1, BL2, and BL3 according to disposition of the contacts CPa, CPb, and CPb, and the sub-scan lines SSL.

The first sub-scan lines SSLa may be disposed in the first pixel block BL1. The first contacts CPa of the first pixel block BL1 may be arranged diagonally with respect to the first direction DR1. For example, as illustrated in FIG. 2, arrangement of the first contacts CPa of the first pixel block BL1 may form a first contact group CG1 in the form of a diagonal line with respect to the first direction DR1.

The second sub-scan lines SSLb may be disposed in the second pixel block BL2. The second contacts CPb of the second pixel block BL2 may be arranged diagonally with respect to the first direction DR1. For example, as illustrated in FIG. 2, arrangement of the second contacts CPb of the second pixel block BL2 may form a second contact group CG2 in the form of a diagonal line with respect to the first direction DR1.

The third sub-scan lines SSLc may be disposed in the third pixel block BL3. Arrangement of the third contacts CPc of the third pixel block BL3 may form a third contact group CG3 in the form of a diagonal line with respect to the first direction DR1.

The arrangements of the first contact group CG1, the second contact group CG2, and the third contact group CG3 may be substantially the same. For example, the first contact group CG1, the second contact group CG2, and the third contact group CG3 having substantially the same arrangement may be formed by etching an insulating layer (or insulating layers) using an identical mask.

However, the foregoing is illustrative, and the arrangements of the first to third contact groups CG1, CG2, and CG3 are not limited thereto, and may be changed in various ways depending on the shape or the like of the display device 1000.

Each of the pixel blocks BL may be divided into a first area A1 and a second area A2 based on corresponding contact groups CG. On the same pixel column, the first area A1 may be closer to the scan driver 200 than the second area A2.

The sub-scan lines SSL may respectively substantially transmit scan signals to corresponding contacts CPa, CPb, and CPc included in the contact groups CG, and the scan signals may be provided to the corresponding scan lines SL through the contacts CPa, CPb, and CPc. Portions of the sub-scan lines SSL that correspond to the first area A1 may be necessary for supply of scan signals. Therefore, the first area A1 may be regarded as a valid area for the supply of the scan signals.

However, other portions of the sub-scan lines SSL that pass through the contact groups CG and are disposed in the second area A2 may be residual portions which are substantially unnecessary for the supply of the scan signals. The second area A2 may be an area where the function of the sub-scan lines SSL is unnecessary.

As such, the first pixel block BL1 may include a first area A1-1 and a second area A2-1. Likewise, the second pixel block BL2 may include a first area A1-2 and a second area A2-2, and the third pixel block BL3 may include a first area A1-3 and a second area A2-3.

In an embodiment, the scan driver 200 may include multiple scan driving circuits GIC1 to GIC24 (or gate driving circuits).

The scan driving circuits GIC1 to GIC24 may be disposed on a side of the pixel component 100. Each of the scan driving circuits GIC1 to GIC24 may drive some of the sub-scan lines SSL.

For example, the fifth scan driving circuit GIC5 may be connected to some of the first sub-scan lines SSLa of the first pixel block BL1. The fifth scan driving circuit GIC5 may supply scan signals to the associated first sub-scan lines SSLa.

The thirteenth scan driving circuit GIC13 may be connected to some of the second sub-scan lines SSLb of the second pixel block BL2. The thirteenth scan driving circuit GIC13 may supply scan signals to the some associated second sub-scan lines SSLb.

The twenty-first scan driving circuit GIC21 may be connected to some of the third sub-scan lines SSLc of the third pixel block BL3. The twenty-first scan driving circuit GIC21 may supply scan signals to the some associated third sub-scan lines SSLc.

For example, in case that the pixel component 100 includes 4320 pixel rows, each of the pixel blocks BL may include 4320 sub-scan lines SSL. Each of the scan driving circuits GIC1 to GIC24 may be connected to 540 sub-scan lines SSL, and two sub-scan lines SSL may be disposed on each pixel column. Each of the scan driving circuits GIC1 to GIC24 may be connected to the sub-scan lines SSL which overlap 270 pixel columns.

However, because a horizontal resolution (e.g., the number of pixel column) and a vertical resolution (e.g., the number of pixel rows) of the pixel component 100 are different, the sub-scan lines SSL may not be disposed (or may not overlap) on some pixel columns of the pixel blocks BL. For example, in the case of the pixel component 100 having a resolution of 8K, the pixel component 100 may have 4320 pixel rows and 7680 pixel columns. Each of the pixel blocks BL may include 2560 pixel columns.

According to the foregoing arrangement rule of the sub-scan lines SSL, the sub-scan lines SSL may not pass through 400 pixel columns (i.e., 2560−270*8=400) in each of the pixel blocks BL (in other words, the sub-scan lines SSL may not overlap the 400 pixel columns), and due to a difference in wiring patterns between the pixel columns, a difference in parasitic capacitance, a different in luminance, or the like between the pixel columns may be caused.

To overcome the foregoing problem, dummy lines (indicated by DML in FIG. 3) having a pattern similar to that of the sub-scan lines SSL may be disposed on the pixel columns that do not overlap the sub-scan lines SSL. For example, groups of dummy lines may be arranged at regular intervals.

Figure 3:
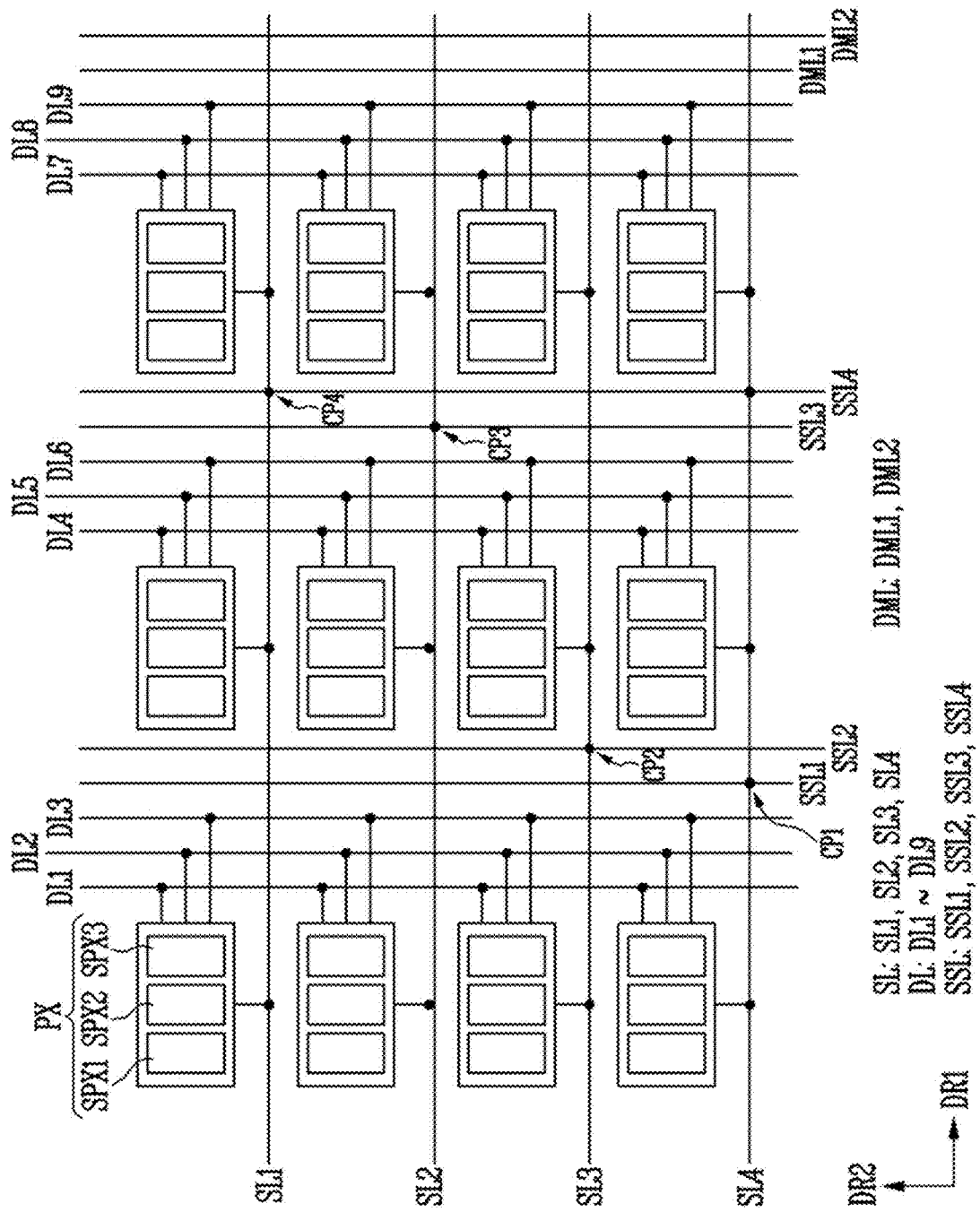
FIG. 3 is a schematic diagram illustrating a portion of a pixel component of FIG. 2 in accordance with embodiments of the disclosure.

FIG. 3 is a schematic diagram illustrating a portion of the pixel component 100 of FIG. 2 in accordance with embodiments of the disclosure.

Referring to FIGS. 1, 2, and 3, the pixel component 100 may include pixels PX, scan lines SL, data lines DL, sub-scan lines SSL, and dummy lines DML. For example, FIG. 3 is a diagram schematically illustrating a portion of the first pixel block BL1. The terms "1st", "first" and the like are used to distinguish relative locations/dispositions of components illustrated in FIG. 3 from each other, and are not limited to absolute locations of the corresponding components in the pixel component 100.

In an embodiment, the pixel PX may include a first sub-pixel SPX1, a second sub-pixel SPX2, and a third sub-pixel SPX3. The first sub-pixel SPX1, the second sub-pixel SPX2, and the third sub-pixel SPX3 may emit light of different colors. For example, the first sub-pixel SPX1, the second sub-pixel SPX2, and the third sub-pixel SPX3 each may emit one of red light, green light, and blue light.

The arrangement of pixels PX in the first direction DR1 may be regarded as a pixel row, and the arrangement of pixels PX in the second direction DR2 may be regarded as a pixel column.

The first sub-pixel SPX1, the second sub-pixel SPX2, and the third sub-pixel SPX3 may be connected to different data lines DL. For example, in a first pixel column in FIG. 3, the first sub-pixel SPX1 may be connected to a first data line DL1, the second sub-pixel SPX2 may be connected to a second data line DL2, and the third sub-pixel SPX3 may be connected to a third data line DL3. Likewise, in a second pixel column, the first, second, and third sub-pixels SPX1, SPX2, and SPX3 of the pixels PX may be respectively connected to fourth, fifth, and sixth data lines DL4, DL5, and DL6. In a third pixel column, the first, second, and third sub-pixels SPX1, SPX2, and SPX3 of the pixels PX may be respectively connected to seventh, eighth, and ninth data lines DL7, DL8, and DL9.

A first scan line SL1 may be connected in common to the pixels PX of a first pixel row. The first scan line SL1 may be connected to each of the first, second, and third sub-pixels SPX1, SPX2, and SPX3 of the pixels PX of the first pixel row. Likewise, second, third, and fourth scan lines SL2, SL3, and SL4 may be respectively connected to the second, third, and fourth pixel rows.

In an embodiment, a first sub-scan line SSL1 and a second sub-scan line SSL2 may extend in the second direction DR2 corresponding to the first pixel column. Although FIG. 3 illustrates a connection relationship between the signal lines and the pixels PX, the first sub-scan line SSL1 and the second sub-scan line SSL2 may overlap the first pixel column.

The first sub-scan line SSL1 may be connected to the fourth scan line SL4 through a first contact CP1. The second sub-scan line SSL2 may be connected to the third scan line SL3 through a second contact CP2.

In an embodiment, a third sub-scan line SSL3 and a fourth sub-scan line SSL4 may extend in the second direction DR2 corresponding to the second pixel column. For example, the third sub-scan line SSL3 and the fourth sub-scan line SSL4 may overlap the second pixel column.

The third sub-scan line SSL3 may be connected to the second scan line SL2 through a third contact CP3. The fourth sub-scan line SSL4 may be connected to the first scan line SL1 through a fourth contact CP4.

In an embodiment, a first dummy line DML1 and a second dummy line DML2 may extend in the second direction DR2 corresponding to the third pixel column. For example, the first dummy line DML1 and the second dummy line DML2 may overlap a third pixel column. The dummy lines DML may be patterns that float in the pixel component. Due to the disposition of the dummy lines DML, plan layouts of the first to third pixel columns may be similar to each other.

Figure 4:
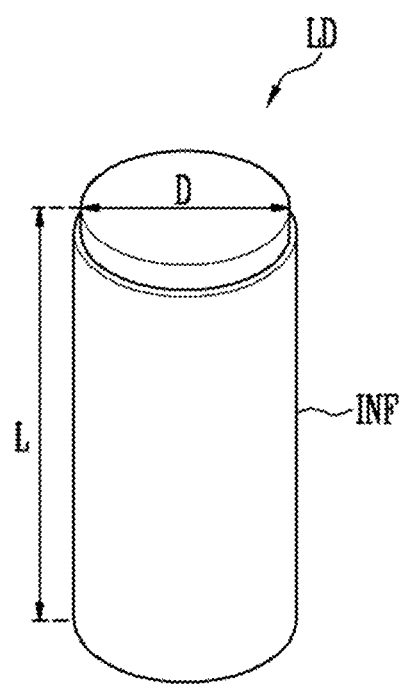
FIG. 4 is a schematic perspective view illustrating a light emitting element included in the display device of FIG. 1 in accordance with embodiments of the disclosure.
Figure 5:
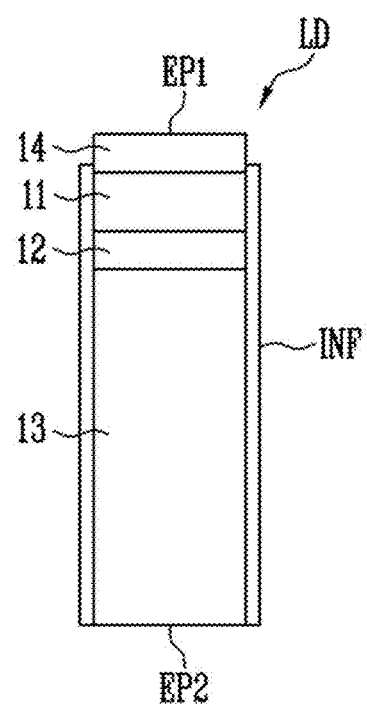
FIG. 5 is a schematic cross-sectional view illustrating the light emitting element of FIG. 4 in accordance with embodiments of the disclosure.

FIG. 4 is a schematic perspective view illustrating a light emitting element LD included in the display device of FIG. 1 in accordance with embodiments of the disclosure. FIG. 5 is a schematic cross-sectional view illustrating the light emitting element LD of FIG. 4 in accordance with embodiments of the disclosure.

Referring to FIGS. 1, 3, 4, and 5, the light emitting element LD included in each of the sub-pixels SPX1, SPX2, and SPX3 may include a first semiconductor layer 11, an active layer 12, and a second semiconductor layer 13. In an embodiment, the light emitting element LD may include an electrode layer 14.

The light emitting element LD may have various shapes. For example, the light emitting element LD may have a pillar shape extending in a direction. The light emitting element LD may include a first end EP1 and a second end EP2. One of the first and second semiconductor layers 11 and 13 may be disposed adjacent to the first end EP1 of the light emitting element LD. Another one of the first and second semiconductor layers 11 and 13 may be disposed adjacent to the second end EP2 of the light emitting element LD. For example, the first semiconductor layer 11 may be disposed adjacent to the first end EP1 of the light emitting element LD, and the second semiconductor layer 13 may be disposed adjacent to the second end EP2 of the light emitting element LD.

In an embodiment, the light emitting element LD may be a light emitting element fabricated in the form of a pillar by an etching or the like. In the specification, the term "pillar-type" may be a rod-like shape and a bar-like shape such as a cylindrical shape and a prismatic shape having an aspect ratio greater than 1, but the cross-sectional shape thereof is not limited.

The light emitting element LD may have a small size corresponding to a range from the nanometer scale to the micrometer scale. For example, the light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include a p-type semiconductor layer.

The active layer 12 may be disposed between the first semiconductor layer 11 and the second semiconductor layer 13. The active layer 12 may include a structure of a single well structure, a multi-well structure, a single-quantum well structure, a multi-quantum well (MQW) structure, a quantum dot structure, or a quantum line structure, but the disclosure is not limited thereto. The active layer 12 may include GaN, InGaN, InAlGaN, AlGaN, or AlN, or various other materials may be included in the active layer 12.

If a voltage equal to or greater than a threshold voltage is applied between the opposite ends of the light emitting element LD, the light emitting element LD may emit light by coupling of electron-hole pairs in the active layer 12.

The second semiconductor layer 13 may be disposed on the active layer 12 and include a semiconductor layer of a type different from that of the first semiconductor layer 11.

The electrode layer 14 may be disposed on the first end EP1 and/or the second end EP2 of the light emitting element LD. Although FIG. 5 illustrates the case where the electrode layer 14 is formed on the first semiconductor layer 11, the disclosure is not limited thereto. For example, a separate electrode layer may be further disposed on the second semiconductor layer 13.

The electrode layer 14 may include transparent metal or transparent metal oxide. For example, the electrode layer 14 may include at least one of indium tin oxide (ITO), indium zinc oxide (IZO), and zinc tin oxide (ZTO), but the disclosure is not limited thereto. As such, in case that the electrode layer 14 is formed of transparent metal or transparent metal oxide, light generated from the active layer 12 of the light emitting element LD may be emitted out of the light emitting element LD through the electrode layer 14.

An insulating layer INF may be provided on a surface of the light emitting element LD. The insulating layer INF may be directly disposed on a surface of the first semiconductor layer 11, a surface of the active layer 12, a surface of the second semiconductor layer 13, and/or a surface of the electrode layer 14. The insulating layer INF may expose the first and second ends EP1 and EP2. In an embodiment, the insulating layer INF may expose a sidewall of the electrode layer 14 and/or the second semiconductor layer 13 disposed adjacent to the first and second ends EP1 and EP2 of the light emitting element LD.

The insulating layer INF may prevent the active layer 12 from short-circuiting by contacting conductive material except the first and second semiconductor layers 11 and 13. Furthermore, the insulating layer INF may minimize a surface defect of the light emitting element LD, thus enhancing the lifetime and emission efficiency of the light emitting element LD.

The insulating film INF may include at least one of silicon oxide ($SiO_x$), silicon nitride ($SiN_x$), silicon oxynitride ($SiO_xN_y$), aluminum nitride (AlNx), aluminum oxide ($AlO_x$), zirconium oxide (ZrOx), hafnium oxide (HfOx), and titanium dioxide ($TiO_x$). In an embodiment, the insulating layer INF may be omitted.

Figure 6:
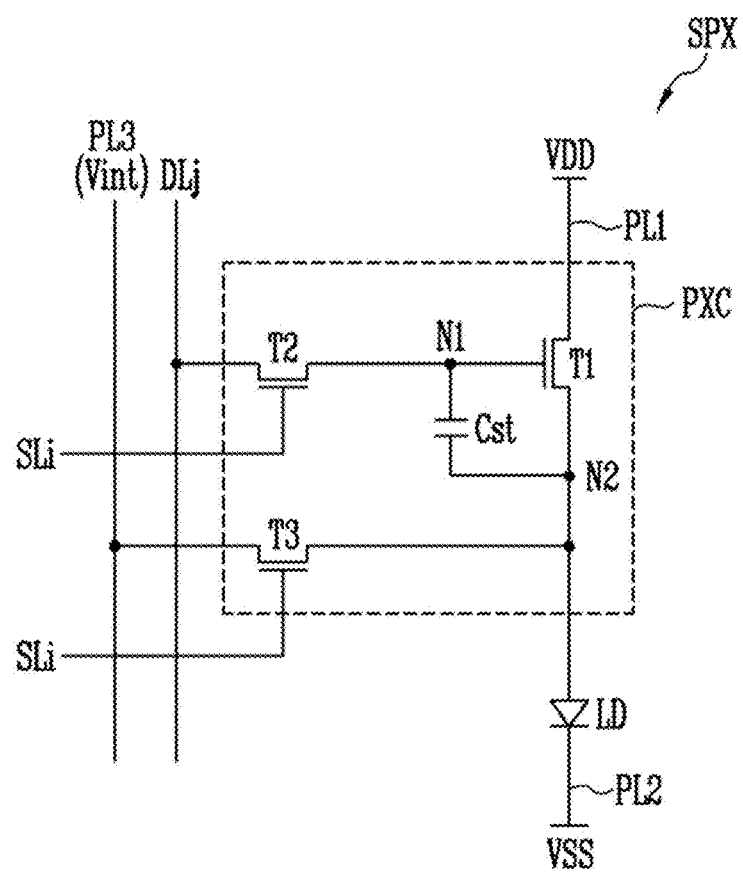
FIG. 6 is a schematic diagram of an equivalent circuit of a sub-pixel included in the pixel component of FIG. 3 in accordance with embodiments of the disclosure.

FIG. 6 is a schematic diagram of an equivalent circuit of a sub-pixel SPX included in the pixel component of FIG. 3 in accordance with embodiments of the disclosure.

Referring to FIGS. 3, 4, 5, and 6, the sub-pixel SPX may include a pixel circuit PXC and a light emitting element LD.

The light emitting element LD may be the light emitting element LD described with reference to FIGS. 4 and 5. However, the foregoing is only for illustrative purposes, and the light emitting element LD is not limited thereto. For example, the light emitting element LD may be an organic light emitting diode.

A voltage of a first power supply VDD may be supplied to a first power line PL1. A voltage of a second power supply VSS may be supplied to a second power line PL2. The first power supply VDD and the second power supply VSS may have different potentials. A difference in potential between the first and second power supplies VDD and VSS may be set to a value equal to or greater than a threshold voltage of the light emitting elements LD during an emission period of the sub-pixel SPX.

The pixel circuit PXC may be connected to a scan line SLi (where i is a positive integer) and a data line DLj (here j is a positive integer). The pixel circuit PXC may be also connected to a third power line PL3.

In an embodiment, the pixel circuit PXC may include first to third transistors T1 to T3 and a storage capacitor Cst.

The first transistor T1 may be a driving transistor configured to control driving current to be applied to the light emitting element LD. The first transistor T1 may be connected between the first power line PL1 and the light emitting element LD. For example, a first electrode of the first transistor T1 may be connected to the first power line PL1, and a second electrode of the first transistor T1 may be connected to a second node N2. A gate electrode of the first transistor T1 may be connected to a first node N1.

The first transistor T1 may control the amount of driving current to be applied to the light emitting element LD in response to a voltage applied to the first node N1.

The second transistor T2 may be switching transistor configured to select a sub-pixel SPX in response to a scan signal and activate the sub-pixel SPX. The second transistor T2 may be connected between a j-th data line DLj and the first node N1. A gate electrode of the second transistor T2 may be connected to an i-th scan line SLi.

The second transistor T2 may be turned on by a scan signal supplied to the i-th scan line SLi, and may transmit a data signal to the gate electrode of the first transistor T1.

The third transistor T3 may be connected between the third power line PL3 and the second electrode of the first transistor T1 (e.g., the second node N2). In an embodiment, a gate electrode of the third transistor T3 may be connected to the i-th scan line SLi.

The third power line PL3 may provide a voltage of a third power supply Vint (e.g., an initialization power supply). For example, the third power line PL3 may be connected in common to multiple sub-pixels SPX. The voltage of the third power supply Vint may be different from the voltage of the first power supply VDD and the voltage of the second power supply VSS.

In case that the third transistor T3 is turned on, the voltage of the third power supply Vint may be provided to the second node N2. Because the voltage of the third power supply Vint is supplied to the second node N2 in case that a data signal is supplied to the sub-pixel SPX, a voltage corresponding to a difference between the data signal and the third power supply Vint may be stored in the storage capacitor Cst. Therefore, the sub-pixel SPX can be reliably driven.

The storage capacitor Cst may be connected between the first node N1 and the second node N2. The storage capacitor Cst may be charged with a voltage corresponding to a data signal supplied to the first node N1. Hence, the storage capacitor Cst may store a voltage corresponding to a difference between a voltage of the gate electrode of the first transistor T1 and a voltage of the second node N2.

Although FIG. 6 illustrates an embodiment where all of the first, second, and third transistors T1, T2, and T3 included in the pixel circuit PXC are formed of N-type transistors, the disclosure is not limited thereto. For example, at least one of the first, second, and third transistors T1, T2, and T3 may be changed to a P-type transistor. Furthermore, the structure of the pixel circuit PXC may be changed to various other structures.

Figure 7:
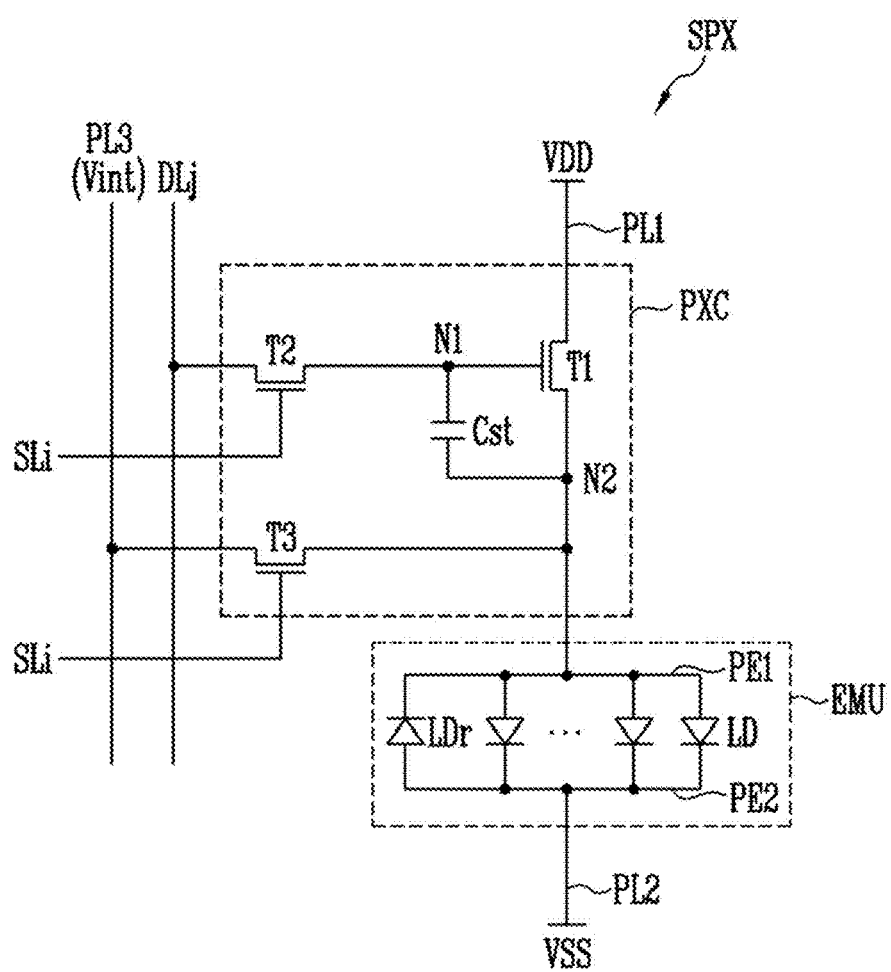
FIG. 7 is a schematic diagram of an equivalent circuit of a sub-pixel included in the pixel component of FIG. 3 in accordance with embodiments of the disclosure.

FIG. 7 is a schematic diagram of an equivalent circuit of a sub-pixel SPX included in the pixel component PXC of FIG. 3 in accordance with embodiments of the disclosure.

In the description of FIG. 7, like references will be used to designate components identical or similar to those described with reference to FIG. 6, and redundant explanation thereof will be omitted. The sub-pixel SPX of FIG. 7, other than the configuration of an emission component EMU, may be substantially identical or similar to the structure of the sub-pixel SPX of FIG. 6.

Referring to FIGS. 3, 4, 5, and 7, the sub-pixel SPX may include a pixel circuit PXC and an emission component EMU.

In an embodiment, the emission component EMU may include light emitting elements LD connected in parallel to each other between the first power line PL1 and the second power line PL2. Each of the light emitting elements LD may be connected to a first pixel electrode PE1 and a second pixel electrode PE2. Each of the light emitting elements LD connected in parallel between the first pixel electrode PE1 and the second pixel electrode PE2 in the same direction (e.g., in a forward direction) may be a valid light source.

In an embodiment, the emission component EMU may further include at least one invalid light source, e.g., a reverse light emitting element LDr. The reverse light emitting element LDr may be connected between the first and second pixel electrodes PE1 and PE2 in a direction opposite to the light emitting elements LD. Current may not substantially flow through the reverse light emitting element LDr.

In an embodiment, the emission component EMU may have a series/parallel combination structure in which the emission components EMU illustrated in FIG. 7 are connected in series to each other, and the driving current may be reduced, compared to that of the emission component having a structure in which the light emitting elements LD are connected only in parallel to each other.

Figure 8:
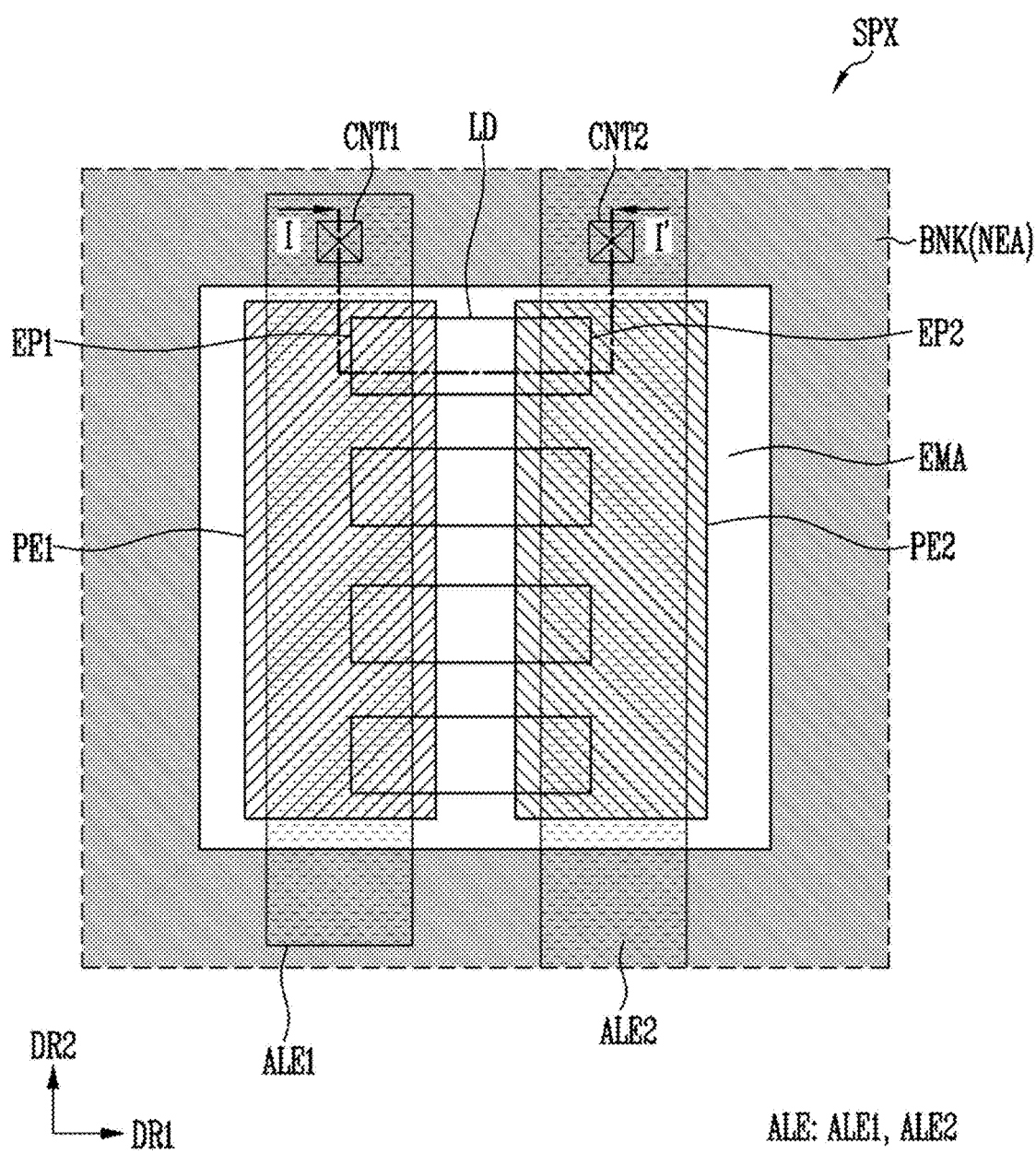
FIG. 8 is a schematic plan view illustrating a sub-pixel included in the pixel component of FIG. 3 in accordance with embodiments of the disclosure.

FIG. 8 is a schematic plan view illustrating a sub-pixel SPX included in the pixel component of FIG. 3 in accordance with embodiments of the disclosure.

Referring to FIGS. 1, 2, 3, 4, 7, and 8, the sub-pixel SPX (or a pixel area) may include an emission area EMA and a non-emission area NEA. The sub-pixel SPX may include a first alignment electrode ALE1, a second alignment electrode ALE2, light emitting elements LD, a first pixel electrode PE1, and a second pixel electrode PE2.

The light emitting elements LD may not be disposed in the non-emission area NEA. A portion of the non-emission area NEA may overlap the bank BNK in a plan view. For example, the bank BNK may define the emission area EMA and the non-emission area NEA. The bank BNK may overlap the non-emission area NEA in a plan view. For example, during a process of supplying the light emitting elements LD to the sub-pixel SPX, the bank BNK may function as a pixel defining layer or a dam structure for defining the emission area EMA to which the light emitting elements LD are to be supplied.

For example, the bank BNK may enclose at least a portion of the emission area EMA.

The alignment electrodes ALE may be electrodes for aligning the light emitting elements LD. The alignment electrodes ALE may include a first alignment electrode ALE1 and a second alignment electrode ALE2.

Each of the alignment electrodes ALE may have a single-layer or multi-layer structure. For example, the alignment electrode ALE may include at least one reflective electrode layer including reflective conductive material, and selectively further include at least one transparent electrode layer and/or a conductive capping layer. In an embodiment, the alignment electrode ALE may include at least one of silver (Ag), magnesium (Mg), aluminum (Al), platinum (Pt), palladium (Pd), gold (Au), nickel (Ni), neodymium (Nd), iridium (Ir), chrome (Cr), titanium (Ti), and an alloy thereof.

The light emitting elements LD may be disposed on the alignment electrode ALE. In an embodiment, the light emitting elements LD may be disposed between the first alignment electrode ALE1 and the second electrode ALE2. The light emitting elements LD may be aligned between the first alignment electrode ALE1 and the second alignment electrode ALE2.

The light emitting elements LD may be aligned in various ways. For example, FIG. 4 illustrates an embodiment in which the light emitting elements LD are aligned in parallel between the first alignment electrode ALE1 and the second alignment electrode ALE2. However, the disclosure is not limited thereto, and the light emitting elements LD may be aligned in series or series/parallel combination structure, and the number of light emitting elements LD which are connected in series and/or parallel to each other is not limited to a particular number.

The first alignment electrode ALE1 and the second alignment electrode ALE2 may be spaced apart from each other. For example, the first alignment electrode ALE1 and the second alignment electrode ALE2 may be spaced apart from each other in the first direction DR1 in the emission area EMA, and each may extend in the second direction DR2.

The first alignment electrode ALE1 and the second alignment electrode ALE2 may be respectively supplied (or provided) with a first alignment signal and a second alignment signal during a process of aligning the light emitting elements LD. For example, ink including light emitting elements LD may be supplied (or provided) to the emission area EMA defined by the bank BNK. The first alignment signal may be supplied to the first alignment electrode ALE1. The second alignment signal may be supplied to the second alignment electrode ALE2. The light emitting elements LD may be aligned by an electric field formed by the first alignment signal and the second alignment signal.

In an embodiment, the first alignment electrode ALE1 may be electrically connected to the first transistor T1 through a first contact hole CNT1.

In an embodiment, the second alignment electrode ALE2 may be electrically connected to a power line (e.g., the second power line PL2 of FIG. 6) through a second contact hole CNT2.

The positions of the first contact hole CNT1 and the second contact hole CNT2 are not limited to the positions illustrated in FIG. 8, and may be appropriately changed in various ways.

The first end EP1 of each of the light emitting elements LD may be disposed adjacent to the first alignment electrode ALE1, and the second end EP2 of the light emitting element LD may be disposed adjacent to the second alignment electrode ALE2.

In an embodiment, the respective first end EP1 of the light emitting elements LD may be electrically connected to the first alignment electrode ALE1 through the first pixel electrode PE1. In an embodiment, the respective first ends EP1 of the light emitting elements LD may be directly connected to the first alignment electrode ALE1.

In an embodiment, the respective first ends EP1 of the light emitting elements LD may be electrically connected to only the first pixel electrode PE1, rather than being connected to the first alignment electrode ALE1, and the first pixel electrode PE1 may be connected to the first transistor T1 disposed therebelow, through a contact hole without contacting the first alignment electrode ALE1.

Likewise, the respective second ends EP2 of the light emitting elements LD may be electrically connected to the second alignment electrode ALE2 and the second power line PL2 through the second pixel electrode PE2. In an embodiment, the respective second ends EP2 of the light emitting elements LD may be directly connected to the second alignment electrode ALE2.

In an embodiment, the respective second ends EP2 of the light emitting elements LD may be electrically connected to only the second pixel electrode PE2, rather than being connected to the second alignment electrode ALE2.

The first pixel electrode PE1 may be disposed on the first ends EP1 of the light emitting elements LD such that the first pixel electrode PE1 is electrically connected to the first ends EP1. In an embodiment, the first pixel electrode PE1 may be disposed on the first alignment electrode ALE1 and electrically connected to the first alignment electrode ALE1.

The second pixel electrode PE2 may be disposed on the second ends EP2 of the light emitting elements LD such that the second pixel electrode PE2 is electrically connected to the second ends EP2. In an embodiment, the second pixel electrode PE2 may be disposed on the second alignment electrode ALE2 and electrically connected to the second alignment electrode ALE2.

Figure 9:
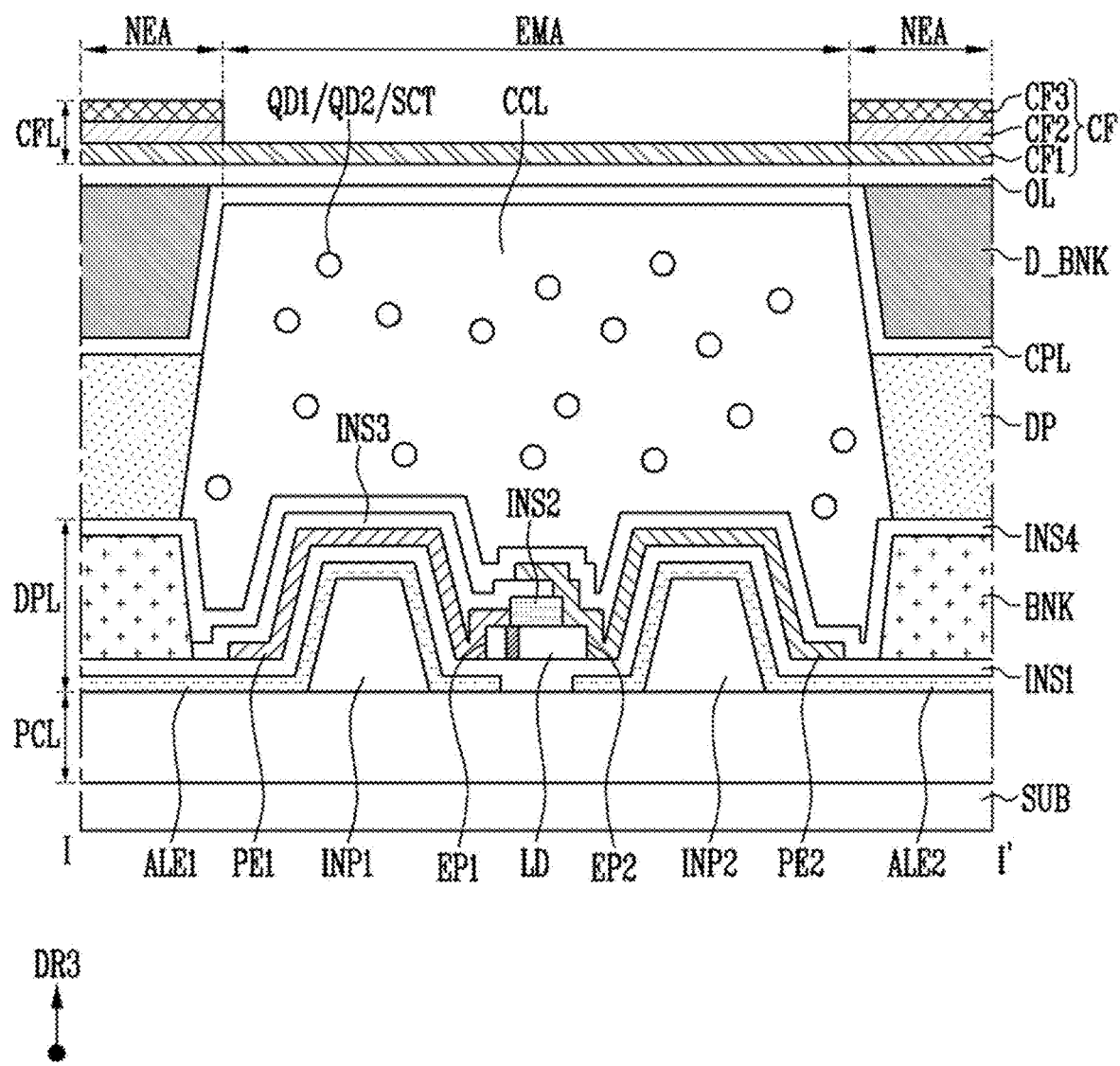
FIG. 9 is a schematic cross-sectional view taken along line I-I' FIG. 8 in accordance with embodiments of the disclosure.

FIG. 9 is a schematic cross-sectional view taken along line I-I' FIG. 8 in accordance with embodiments of the disclosure.

Referring to FIGS. 7, 8, and 9, the sub-pixel SPX may include a substrate SUB, a pixel circuit layer PCL, a display element layer DPL, and a color filter layer CFL. In an embodiment, the sub-pixel SPX may include an optical layer between the display element layer DPL and the color filter layer CFL.

The substrate SUB may form a base of the display device 1000. The substrate SUB may be a rigid or flexible substrate or film. The substrate SUB may include transparent insulating material to allow light transmission.

The pixel circuit layer PCL may be disposed on the substrate SUB. The pixel circuit layer PCL may include a pixel circuit PXC described with reference to FIG. 6. The display element layer DPL may be provided on the pixel circuit layer PCL. The display element layer DPL may include a first insulating pattern INP1, a second insulating pattern INP2, a first alignment electrode ALE1, a second alignment electrode ALE2, a bank BNK, a light emitting element LD, a first pixel electrode PE1, a second pixel electrode PE2, a first insulating layer INS1, a second insulating layer INS2, a third insulating layer INS3, and a fourth insulating layer INS4.

The first insulating pattern INP1 and the second insulating pattern INP2 may be disposed on a via layer (VIA of FIG. 10) of the pixel circuit layer PCL. The first insulating pattern INP1 and the second insulating pattern INP2 may protrude in a thickness-wise direction of the substrate SUB (e.g., in a third direction DR3). The first insulating pattern INP1 and the second insulating pattern INP2 each may include organic material and/or inorganic material.

The light emitting elements LD may be disposed between the first insulating pattern INP1 and the second insulating pattern INP2. For example, the first and second insulating patterns INP1 and INP2 may define spaces in which the light emitting elements LD are received and arranged.

In an embodiment, at least a portion of the first alignment electrode ALE1 may be disposed on the first insulating pattern INP1, and at least a portion of the second alignment electrode ALE2 may be disposed on the second insulating pattern INP2, so that each may function as a reflective partition wall.

In an embodiment, the first alignment electrode ALE1 may be electrically connected to the first end EP1 of the light emitting element LD by the first pixel electrode PE1. The second alignment electrode ALE2 may be electrically connected to the second end EP2 of the light emitting element LD2 by the second pixel electrode PE2. However, the disclosure is not limited thereto. At least one of the first alignment electrode ALE1 and the second alignment electrode ALE2 may be electrically insulated from the light emitting element LD.

The first and second alignment electrodes ALE1 and ALE2 may include a conductive material.

The first insulating layer INS1 may be disposed on the via layer (VIA of FIG. 10) of the pixel circuit layer PCL. The first insulating layer INS1 may cover the first and second alignment electrodes ALE1 and ALE2. The first insulating layer INS1 may include at least one of silicon oxide ($SiO_x$), silicon nitride ($SiN_x$), silicon oxynitride ($SiO_xN_y$), aluminum oxide ($AlO_x$), and titanium oxide ($TiO_x$).

The bank BNK may be disposed on the first insulating layer INS1. The bank BNK may protrude in the thickness-wise direction of the substrate SUB. The bank BNK may have a shape enclosing the emission area EMA. In an embodiment, the bank BNK may include organic material and/or inorganic material. The bank BNK may correspond to the non-emission area NEA.

The light emitting elements LD may be disposed on the first insulating layer INS1. The light emitting element LD may overlap a portion of the first alignment electrode ALE1 and a portion of the second alignment electrode ALE2 in a plan view.

The second insulating layer INS2 may be disposed on the light emitting element LD. The second insulating layer INS2 may cover the active layer (12 of FIG. 5) of the light emitting element LD. Furthermore, the second insulating layer INS2 may prevent adjacent electrodes (e.g., the first pixel electrode PE1 and the second pixel electrode PE2) from short-circuiting with each other. The second insulating layer INS2 may include organic material or inorganic material.

The first pixel electrode PE1 may contact the first end EP1 of the light emitting element LD, and may be disposed on the first insulating layer INS1. The first pixel electrode PE1 may be an anode electrode which is electrically connected to the first transistor T1.

The third insulating layer INS3 may be disposed on the first pixel electrode PE1. The third insulating layer INS3 may prevent the first pixel electrode PE1 and the second pixel electrode PE2 from short-circuiting with each other. The third insulating layer INS3 may include inorganic insulating material.

The second pixel electrode PE2 may contact the second end EP2 of the light emitting element LD, and may be disposed on the first insulating layer INS1, the second insulating layer INS2, and the third insulating layer INS3. The second pixel electrode PE2 may be a cathode electrode which is electrically connected to the second power line PL2.

As illustrated in FIG. 9, the first pixel electrode PE1 and the second pixel electrode PE2 may be disposed on different layers through different processes. However, the disclosure is not limited thereto, and the first pixel electrode PE1 and the second pixel electrode PE2 may be formed of a same material through a same process.

The first pixel electrode PE1 and the second pixel electrode PE2 may include a conductive material.

The fourth insulating layer INS4 may be disposed on the third insulating layer INS3, and may cover the first pixel electrode PE1 and the second pixel electrode PE2. In an embodiment, the fourth insulating layer INS4 may be integrally formed in the entireties of the emission area EMA and the non-emission area NEA, and the fourth insulating layer INS4 may extend over the bank BNK.

The fourth insulating layer INS4 may include at least one of silicon oxide ($SiO_x$), silicon nitride ($SiN_x$), silicon oxynitride ($SiO_xN_y$), aluminum oxide ($AlO_x$), and titanium oxide ($TiO_x$).

The color conversion layer CCL may be disposed on the fourth insulating layer INS4 in the emission area EMA. The color conversion layer CCL may change the wavelength of light provided from the light emitting element LD, or allows the light to pass therethrough. In an embodiment, the light emitting element LD may emit blue light.

For example, in case that the sub-pixel SPX is a red pixel, the color conversion layer CCL may include first color conversion particles QD1. The first color conversion particles QD1 may convert blue light to red light.

In case that the sub-pixel SPX is a green pixel, the color conversion layer CCL may include a second color conversion particles QD2. The second color conversion particles QD2 may convert blue light to green light.

In case that the sub-pixel SPX is a blue pixel, the color conversion layer CCL may include light scattering particles SCT, and may function as a light scattering layer. In an embodiment, in case that the sub-pixel SPX is a blue pixel, a transparent polymer layer may be provided in lieu of the color conversion layer CCL.

In an embodiment, a dummy pattern DP may be disposed on the bank BNK in the non-emission area NEA. In an embodiment, the dummy pattern DP may be directly disposed on the fourth insulating layer INS4 on the bank BNK in the non-emission area NEA. However, the disclosure is not limited thereto, and the dummy pattern DP may be directly disposed on the bank BNK in the non-emission area NEA from which the fourth insulating layer INS4 is removed.

The dummy pattern DP may include inorganic insulating material, or block material/reflective material having light blocking properties. The dummy pattern DP may prevent a light leakage defect in which light (or rays) leaks between the sub-pixel SPX and adjacent sub-pixels SPX.

A capping layer CPL may be disposed on the color conversion layer CCL and the dummy pattern DP. In an embodiment, the capping layer CPL may be provided on the overall surface (or the entirety) of a display area DA and be directly disposed on the dummy pattern DP and the color conversion layer CCL. The capping layer CPL may be an inorganic layer (or an inorganic insulating layer) including inorganic material. The capping layer CPL may cover the color conversion layer CCL and thus protect the color conversion layer CCL.

In an embodiment, a dummy bank D_BNK may be disposed on the capping layer CPL in the non-emission area. For example, an upper surface of the dummy bank D_BNK may have a height similar to that of capping layer CPL or the color conversion layer CCL.

The dummy bank D_BNK may include at least one light blocking material and/or reflective material, and allow light emitted from the light emitting elements LD to more reliably travel in the image display direction (or the third direction DR3) of the display device 1000, thus enhancing the light output efficiency of the light emitting elements LD.

In an embodiment, the dummy bank D_BNK may be omitted, and the corresponding portion may be charged with an organic layer OL which is a planarization layer.

An organic layer OL may be disposed on the capping layer CPL and the dummy bank D_BNK. The organic layer OL may mitigate a step difference formed by components disposed therebelow, and thus provide a planarization surface on the top thereof. For example, the organic layer OL may function as a planarization layer. The organic layer OL may be a common layer provided in common in the display area DA, but the disclosure is not limited thereto.

The color filter layer CFL may be disposed on the organic layer OL. The color filter layer CFL may include color filters CF including a first color filter CF1, a second color filter CF2, and a third color filter CF3.

The color filters CF may each allow light of a specific color to selectively pass therethrough. The first color filter CF1, the second color filter CF2, and the third color filter CF3 may be respectively a red color filter, a green color filter, and a blue color filter, depending on the emission color of the sub-pixel. In an embodiment, the first, second, and third color filters CF1, CF2, and CF3 may overlap each other and be stacked each other in at least a portion of the non-emission area NEA. Therefore, the stacked structure of the color filters CF in the non-emission area NEA may have a light blocking function, and function to improve the display quality.

Figure 10:
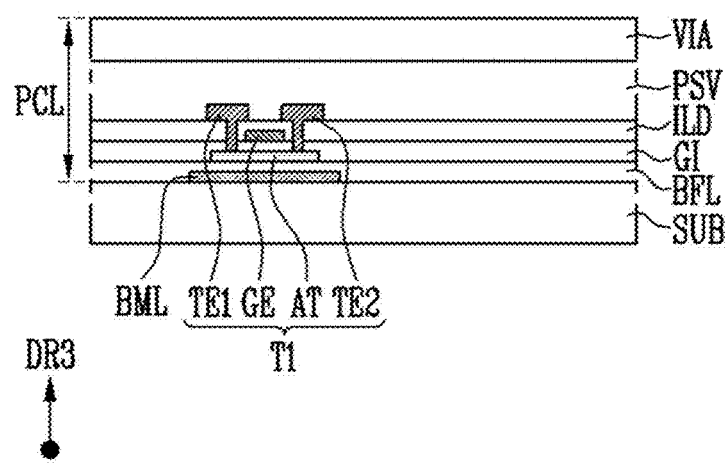
FIG. 10 is a schematic cross-sectional view illustrating a pixel circuit layer of FIG. 9 in accordance with embodiments of the disclosure.

FIG. 10 is a schematic cross-sectional view illustrating the pixel circuit layer PCL of FIG. 9 in accordance with embodiments of the disclosure.

Referring to FIGS. 7, 8, 9, and 10, the pixel circuit layer PCL may include a bottom metal layer BML, a buffer layer BFL, a first transistor T1, a gate insulating layer GI, an interlayer insulating layer ILD, a passivation layer PSV, and a via layer VIA. FIG. 10 illustrates only the first transistor T1 among the circuit elements, for convenience of explanation.

The bottom metal layer BML may be disposed on the substrate SUB. The bottom metal layer BML may be patterned as portions of various signal lines. In an embodiment, a portion of the bottom metal layer BML may overlap the first transistor T1.

The buffer layer BFL may be disposed on the substrate SUB. The buffer layer BFL may cover the bottom metal electrode BML. The buffer layer BFL may prevent impurities from diffusing from the outside. The buffer layer BFL may include inorganic insulating material.

The first transistor T1 may be electrically connected to the light emitting elements LD. The first transistor T1 may include an active pattern AT, a first transistor electrode TE1, a second transistor electrode TE2, and a gate electrode GE.

The active pattern AT may be formed of a semiconductor pattern layer. The active pattern AT may be disposed on the buffer layer BFL. The active pattern AT may include at least one of polysilicon, low temperature polycrystalline silicon (LTPS), amorphous silicon, and an oxide semiconductor.

The active pattern AT may include a first contact area which contacts the first transistor electrode TE1, and a second contact area which contacts the second transistor electrode TE2. Each of the first contact area and the second contact area may be a semiconductor pattern doped with impurities. An area between the first contact area and the second contact area may be a channel area. The channel area may be an intrinsic semiconductor pattern undoped with impurities.

The gate electrode GE may be disposed on the gate insulating layer GI. The gate electrode GE may correspond to the position of the channel area of the active pattern AT.

The gate insulating layer GI may be disposed on the active pattern AT. The gate insulating layer GI may include inorganic material.

The interlayer insulating layer ILD may be disposed on the gate electrode GE. The interlayer insulating layer ILD may include inorganic insulating material.

The first transistor electrode TE1 and the second transistor electrode TE2 may be disposed on the interlayer insulating layer ILD. The first transistor electrode TE1 may contact the first contact area of the active pattern AT through a contact hole penetrating the gate insulating layer GI and the interlayer insulating layer ILD. The second transistor electrode TE2 may contact the second contact area of the active pattern AT through a contact hole penetrating the gate insulating layer GI and the interlayer insulating layer ILD. For example, each of the first transistor electrode TE1 and the second transistor electrode TE2 may be a drain electrode or a source electrode, respectively.

In an embodiment, the second transistor electrode TE2 may be electrically connected to the first pixel electrode PE1 of the display element layer DPL through a bridge pattern, a contact hole, or the like.

The passivation layer PSV may be disposed on the interlayer insulating layer ILD. The passivation layer PSV may include organic material and/or inorganic material. The passivation layer PSV may prevent impurities from diffusing.

The via layer VIA may be disposed on the passivation layer PSV. The via layer VIA may be provided in the form of an organic insulating layer, an inorganic insulating layer, or a structure including an organic insulating layer disposed on an inorganic insulating layer. The inorganic insulating layer may include, for example, at least one of silicon oxide ($SiO_x$), silicon nitride ($SiN_x$), silicon oxynitride ($SiO_xN_y$), and metal oxide such as aluminum oxide ($AlO_x$). The organic insulating layer may include, for example, at least one of a polyacrylic resin, an epoxy resin, a phenolic resin, a polyamide resin, a polyimide rein, an unsaturated polyester resin, a poly-phenylene ether resin, a poly-phenylene sulfide resin, and a benzocyclobutene resin.

The display element layer DPL may be provided on the via layer VIA.

Figure 11:
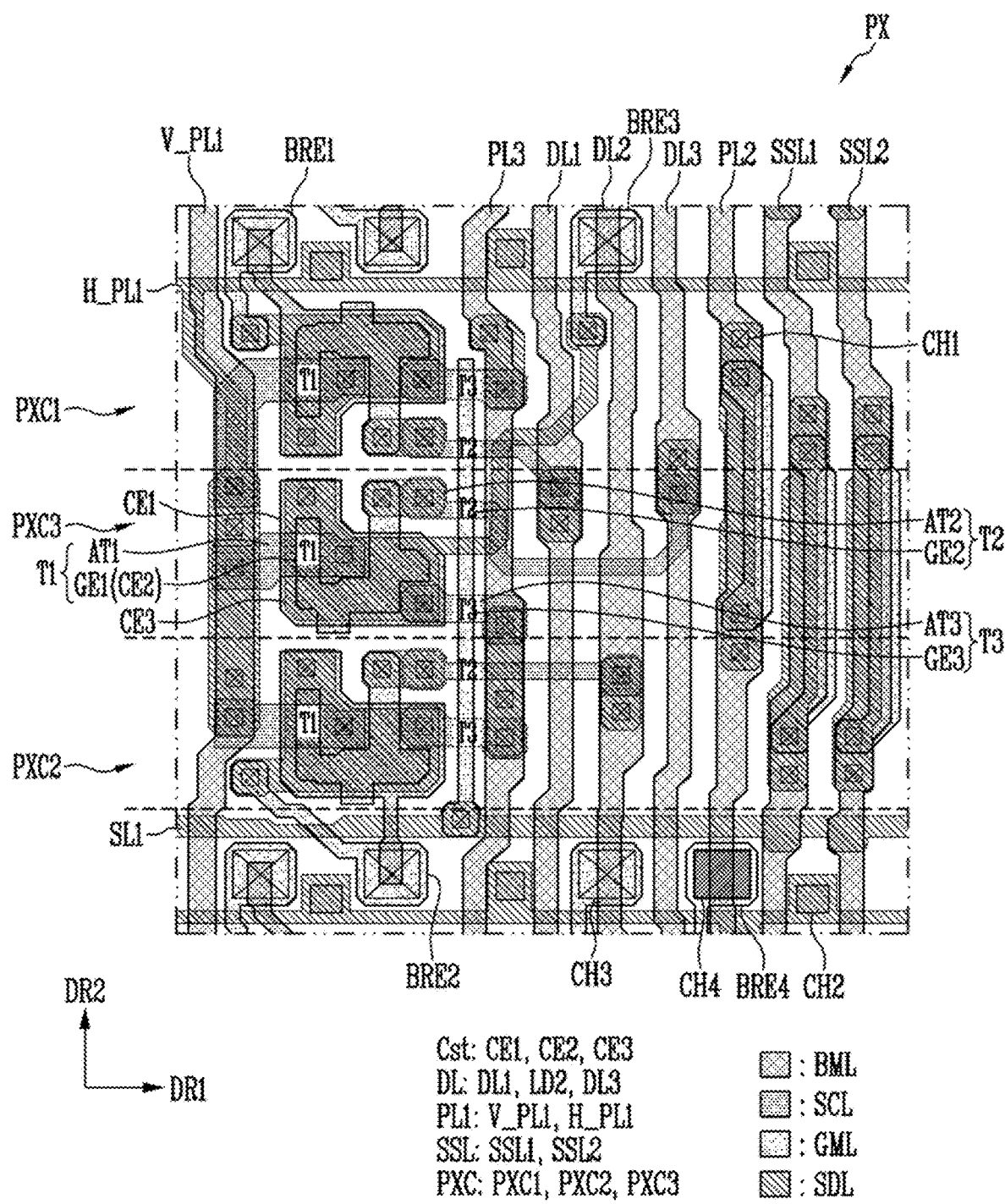
FIG. 11 is a schematic diagram illustrating a pixel circuit layer of a pixel included in the pixel component of FIG. 3 in accordance with embodiments of the disclosure.

FIG. 11 is a schematic layout diagram illustrating the pixel circuit layer PCL of the pixel PX included in the pixel component 100 of FIG. 3 in accordance with embodiments of the disclosure.

Referring to FIGS. 3, 7, 10, and 11, the pixel circuit layer PCL of the sub-pixel SPX may include a pixel circuit PXC, a scan line SL1 (or a first scan line), data lines DL, a first power line PL1, a second power line PL2, a third power line PL3, and sub-scan lines SSL.

The pixel circuit PXC, the scan line SL1 (or the first scan line), the data lines DL, the first power line PL1, the second power line PL2, the third power line PL3, and the sub-scan lines SSL may be formed of a bottom metal layer BML, a semiconductor pattern layer SCL, a gate layer GML, or a top metal layer SDL which are disposed in different layers.

First contact holes CH1 may electrically connect the top metal layer SDL to at least one of the bottom metal layer BML, the semiconductor pattern layer SCL, and the gate layer GML that overlaps the top metal layer SDL. For example, all of the first contact holes CH1 may be connected to the top metal layer SDL. In FIG. 11, the first contact holes CH1 are indicated by a relatively small X-mark.

Second contact holes CH2 may electrically connect the top metal layer SDL to an alignment electrode ALE (e.g., the second alignment electrode ALE2 (refer to FIGS. 8 and 9)) of the display element layer DPL that overlaps the top metal layer SDL. For example, each of the second contact holes CH2 may be formed to supply a signal for alignment to the corresponding alignment electrode ALE through a first horizontal power line H_PL1 during a process of aligning the light emitting element LD.

The third contact holes CH3 may respectively electrically connect bridge electrodes (e.g., first, second, and third bridge electrodes BRE1, BRE2, and BRE3) of the gate layer GML extending from the first transistor T1 (e.g., a first transistor electrode TE1 of the first transistor T1) with first pixel electrodes PE1 (refer to FIG. 9) of the display element layer DPL that overlap the bridge electrodes. In FIG. 11, the third contact holes CH3 are indicated by X-marks larger than that of the first contact holes CH1.

A fourth contact hole CH4 may electrically connect a fourth bridge electrode BRE4, which is electrically connected to the second power line PL2, to a second pixel electrode PE2 (refer to FIG. 9) of the display element layer DPL that overlaps the fourth bridge electrode BRE4. The fourth bridge electrode BRE4 may be included in the gate layer GML.

The pixel circuit PXC may be divided into a first pixel circuit PXC1, a second pixel circuit PXC2, and a third pixel circuit PXC3. The first pixel circuit PXC1 and the second pixel circuit PXC2 may be symmetrical to each other based on an imaginary line extending in the first direction DR1. The second pixel circuit PXC2 and the third pixel circuit PXC3 may have substantially the same structure. Therefore, common configuration of the first to third pixel circuits PXC1 to PXC3 will be described based on the third pixel circuit PXC3, and redundant explanation thereof will be omitted.

The bottom metal layer BML may include a first vertical power line V_PL1, the second power line PL2, the third power line PL3, a first capacitor electrode CE1, the data lines DL, and the sub-scan lines SSL.

The first vertical power line V_PL1, the second power line PL2, the third power line PL3, the first capacitor electrode CE1, the data lines DL, and the sub-scan lines SSL may be spaced apart from each other, and may extend in the second direction DR2. For example, the third power line PL3, the first data line DL1, the second data line DL2, the third data line DL3, the second power line PL2, the first sub-scan line SSL1, and the second sub-scan line SSL2 may be successively arranged in the first direction. On a side of the second sub-scan line SSL2, the first vertical power line V_PL1 of an adjacent pixel column may be disposed.

The first vertical power line V_PL1 may be connected to the first horizontal power line H_PL1 through a first contact hole CH1. The first power line PL1 may include the first vertical power line V_PL1 and the first horizontal power line H_PL1.

The first data line DL1 may be connected to the second transistor T2 of the first pixel circuit PXC1. The second data line DL2 may be connected to the second transistor T2 of the second pixel circuit PXC2. The third data line DL3 may be connected to the second transistor T2 of the third pixel circuit PXC3.

The third power line PL3 may be connected to the third transistors T3 of the first to third pixel circuits PXC1 to PXC3 through a first contact hole CH1.

As described above, the second power line PL2 may be connected to the second pixel electrode PE2 (refer to FIG. 9) of the display element layer DPL through the fourth bridge electrode BRE4 and the fourth contact hole CH4.

The first sub-scan line SSL1 and the second sub-scan line SSL2 may be respectively connected to different scan lines through first contact holes CH1. Although not illustrated, the first sub-scan line SSL1 and the second sub-scan line SSL2 may be respectively connected to different scan lines rather than to the first scan line SL1.

The first capacitor electrode CE1 may be an electrode of the storage capacitor Cst of each pixel circuit PXC, and may be disposed in the form of an island.

The semiconductor pattern SCL may be disposed on the bottom metal layer BML. The semiconductor pattern SCL may include the active patterns AT1, AT2, and AT3 of the first, second, and third transistors T1, T2, and T3 of each of the first to third pixel circuits PXC1 to PXC3.

The first contact area of the first active pattern AT1 may be connected to a portion extending from the first horizontal power line H_PL1 in a direction opposite to the second direction DR2 through a first contact hole CH1. The second contact area of the first active pattern AT1 may be connected to a third capacitor electrode CE3 provided thereover.

The first contact area of the second active pattern AT2 may be connected to a corresponding data line (e.g., the third data line DL3 in the case of the third pixel circuit PXC3) through a first contact hole CH1 and a connection pattern of the top metal layer SDL. The second contact area of the second active pattern AT2 may be connected to the gate electrode GE1 of the first transistor T1 through a first contact hole CH1 and a connection pattern of the top metal layer SDL.

The first contact area of the third active pattern AT3 may be connected to the third power line PL3 through a first contact hole CH1 and a connection pattern of the top metal layer SDL. The second contact area of the third active pattern AT3 may be electrically connected to the third capacitor electrode CE3 and the second contact area of the first active pattern AT1 through a first contact hole CH1 and a connection pattern of the top metal layer SDL.

The first contact area and the second contact area each may be one of a drain area and a source area of a transistor.

The gate layer GML may be disposed on the semiconductor pattern layer SCL. The gate layer GML may include a first gate electrode GE1, a second gate electrode GE2, a third gate electrode GE3, and a second capacitor electrode CE2. The gate layer GML may further include first to fourth bridge electrodes BRE1 to BRE4 described above.

The first gate electrode GE1 may overlap the channel area of the first active pattern AT1 in a plan view.

The second capacitor electrode CE2 may be integrally formed with the first gate electrode, and may overlap the first capacitor electrode CE1 and the third capacitor electrode CE3. For example, the first capacitor electrode CE1 and the second capacitor electrode CE2 may form a first sub-capacitor. The second capacitor electrode CE2 and the third capacitor electrode CE3 may form a second sub-capacitor. The first and second sub-capacitors may form a storage capacitor Cst as a series connection structure. Therefore, the storage capacitor Cst may have sufficient capacity.

The second gate electrode GE2 may overlap the channel area of the second active pattern AT2 in a plan view. The third gate electrode GE3 may overlap the channel area of the third active pattern AT3 in a plan view. In an embodiment, the second and third gate electrodes GE2 and GE3 of the pixel pixels PXC may be integral with each other and may extend in the second direction DR2. The pattern including the second and third gate electrodes GE2 and GE3 may be connected to the first scan line SL1 through a first contact hole CH1.

The top metal layer SDL may be disposed on the gate layer GML. The top metal layer SDL may include the first horizontal power line H_PL1, the first scan line SL1, the third capacitor electrode CE3, and various connection patterns.

The first horizontal power line H_PL1 may extend in the first direction DR1. The first horizontal power line H_PL1 may have a portion extending in the second direction DR2, and may be connected to the first transistors T1 (e.g., the first contact areas of the first transistors T1) or the first vertical power line V_PL1 through a first contact hole CH1.

The first horizontal power line H_PL1 may be connected to an alignment electrode ALE (e.g., the second alignment electrode ALE2 (refer to FIGS. 8 and 9)) of the display element layer DPL through a second contact hole CH2.

The first scan line SL1 may be spaced apart from the first horizontal power line H_PL1 in the second direction DR2, and may extend in the first direction DR1. The first scan line SL1 may be connected to the second and third gate electrodes GE2 and GE3 through a first contact hole CH1. For example, the contact holes (e.g., CPa, CPb, and CPc of FIG. 2) through which the first scan line SL1 is connected to the corresponding sub-scan lines among the first contact holes CH1 may be respectively formed in the first, second, and third contact groups (CG1, CG2, and CG3 of FIG. 2). Each of the contact holes through which the first scan line SL1 is connected to the corresponding sub-scan lines may be formed through the interlayer insulating layer ILD, the gate insulating layer GI, and the buffer layer BFL.

The third capacitor electrode CE3 may overlap the first and second capacitor electrodes CE1 and CE2 in a plan view. The third capacitor electrode CE3 may be connected to the first capacitor electrode CE1, the first active pattern AT1, and the third active pattern AT3 through a first contact hole CH1.

The connection patterns may connect, through the first contact holes CH1, lower components that overlap the connection patterns.

In an embodiment, as illustrated in FIG. 11, the gate layer GML and the top metal layer SDL each may further include patterns which respectively overlap and connect with the second power line PL2, the first sub-scan line SSL1, and the second sub-scan line SSL2. The patterns may reduce resistance and/or disconnection defects of the second power line PL2, the first sub-scan line SSL1, and the second sub-scan line SSL2.

In an embodiment, depending on the location of the pixel PX in the pixel component 100, the dummy lines DML or supplementary power lines (e.g., SP_PL1 and SP_PL2 of FIGS. 13 and 15) may be disposed at locations corresponding to where the first sub-scan line SSL1 and the second sub-scan line SSL2 are disposed.

Figure 12:
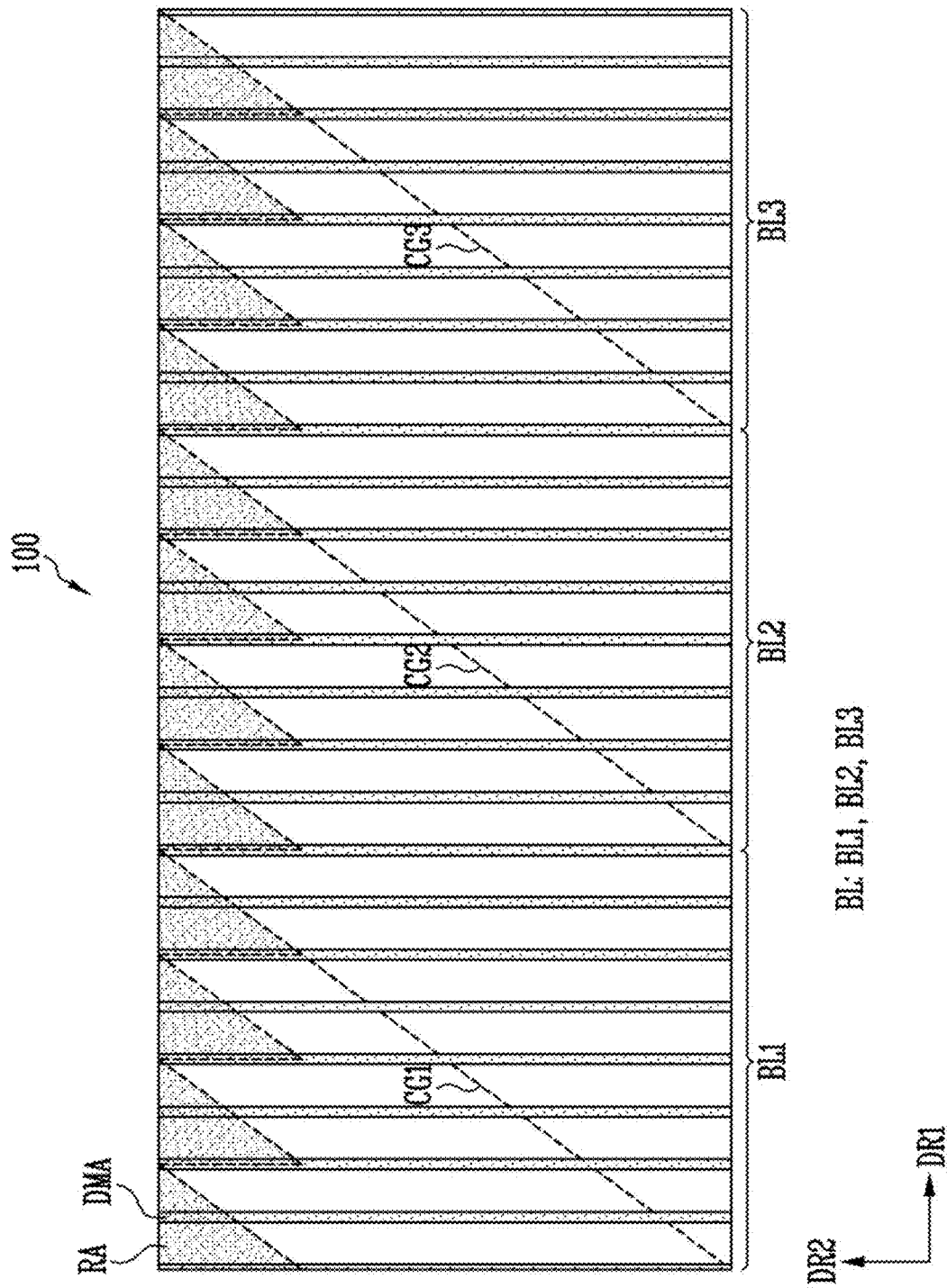
FIG. 12 is a schematic view for describing a bottom metal layer of the pixel component of FIG. 3 in accordance with embodiments of the disclosure.
Figure 13:
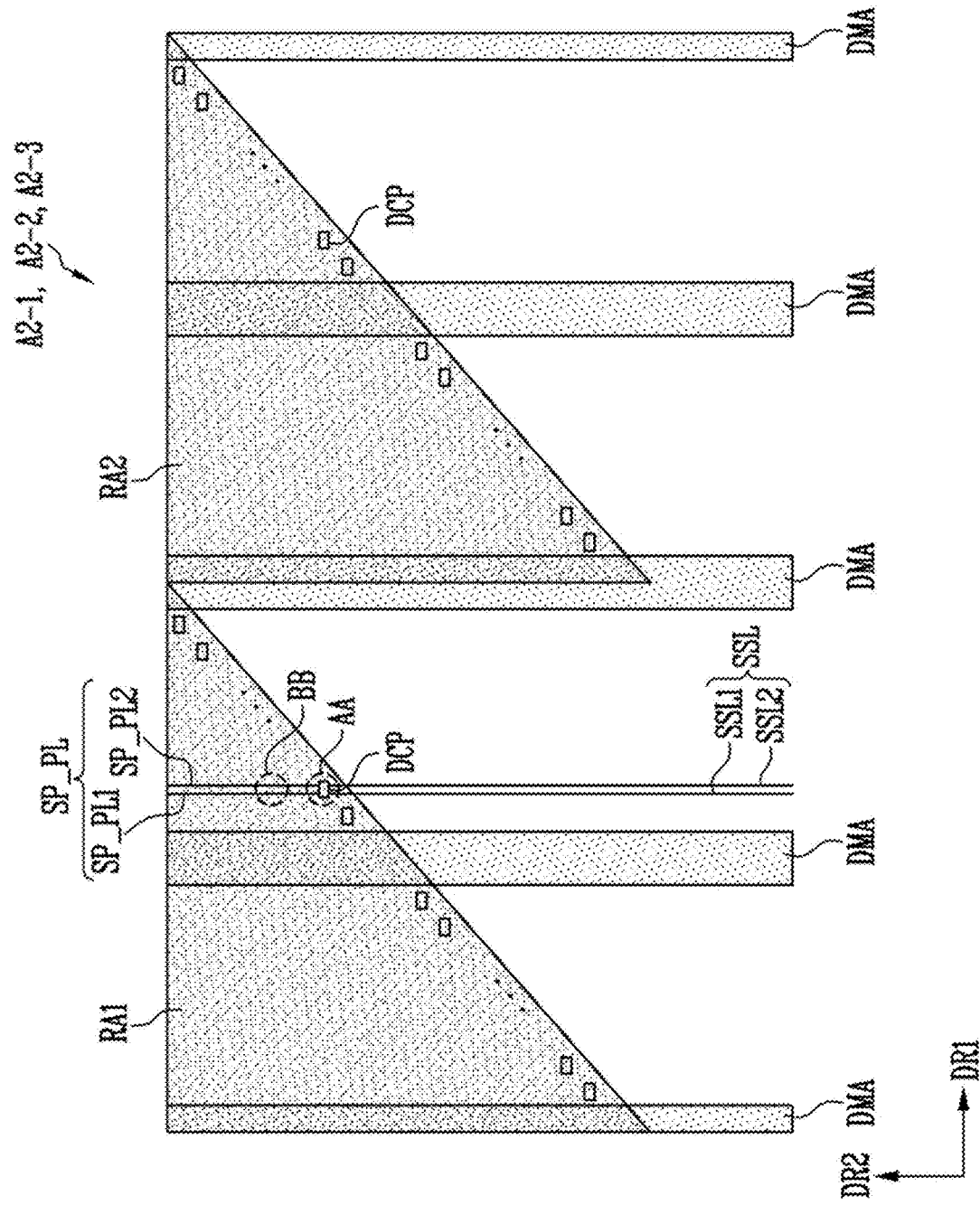
FIG. 13 is a schematic enlarged view illustrating a portion of the pixel component of FIG. 12 in accordance with embodiments of the disclosure.

FIG. 12 is a schematic view for describing the bottom metal layer of the pixel component of FIG. 3 in accordance with embodiments of the disclosure. FIG. 13 is a schematic enlarged view illustrating a portion of the pixel component of FIG. 12 in accordance with embodiments of the disclosure.

Referring to FIGS. 2, 3, 11, 12, and 13, the pixel component 100 may include first, second, and third pixel blocks BL1, BL2, and BL3.

The first, second, and third pixel blocks BL1, BL2, and BL3 may be separated from each other based on the first contact group CG1, the second contact group CG2, and the third contact group CG3. The first, second, and third pixel blocks BL1, BL2, and BL3 each may include a bottom metal layer BML having substantially the same shape (structure or pattern).

As described with reference to FIG. 11, the bottom metal layer BML of the pixel component 100 may include the first vertical power line V_PL1, the second power line PL2, the third power line PL3, the first capacitor electrode CE1, the data lines DL, and the sub-scan lines SSL. The bottom metal layer BML may further include dummy lines DML (refer to FIG. 3) and supplementary power lines SP_PL (refer to FIG. 13).

The dummy lines DML may extend in the second direction DR2 in a dummy line area DMA of the pixel component 100. Dummy line areas DMA may be disposed (repeated) at regular intervals in the first direction DR1. The dummy lines DML may be arranged in the dummy line area DMA. 46 dummy lines DML may be arranged in the first direction DR1 in the dummy line areas DMA other than the dummy line areas DMA that are disposed at left and right outermost sides of the pixel component 100. Two dummy lines DML may be disposed in each pixel column, and 46 dummy lines DML may be disposed to correspond to 23 successive pixel columns. For example, the dummy lines DML may be disposed at positions substituting for the sub-scan lines SSL in the dummy line area DMA.

In an embodiment, each of the dummy lines DML may be formed in the form of an island in the pixel component 100, and no current may flow through the dummy lines DML.

As described above, there is no need to supply scan signals to the second area A2 (refer to FIG. 2) of the pixel blocks BL through the sub-scan lines SSL. Therefore, the lengths of the sub-scan lines SSL may be reduced by partially removing unnecessary portions of the sub-scan lines SSL, so that IR drop of a scan signal in the display device having a single side driving structure may be reduced. For example, as illustrated in FIG. 13, ends of the sub-scan lines SSL may be located on a disconnected portion DCP in the second area (e.g., the second area A2-1 of the first pixel block BL1 and, hereinafter, referred to as the second area A2-1).

A mask may be used to perform a process (e.g., a patterning process or an etching process) of forming the disconnected portion DCP for the sub-scan lines SSL. The bottom metal layer BML of the disconnected portion DCP may be removed (or etched) through an exposure process using a mask.

As the pixel component 100 to be applied to a television (TV) or the like is increased in size, the surface areas of the second areas A2-1, A2-2, and A2-3 including the disconnected portions DCP may also be increased. Due to process limitations (e.g., limitations in the size of the mask or the size of exposure equipment), an increase in size of the mask (e.g., a valid exposure area of the mask) for patterning the bottom metal layer BML may be limited, and the exposure process may be required to be performed several times while moving the mask on the pixel component 100 of the display panel to pattern the bottom metal layer BML for the second areas A2-1, A2-2, and A2-3.

In case that exposure operations are performed successively on the pixel component 100 while moving the mask by areas, a portion patterned in a boundary between exposure areas may be formed with stitch type spots (hereinafter, referred to as "stitch spots") on a corresponding metal layer. Such spots may have negative effects on process distribution and reliability.

Therefore, to prevent the stitch spots form occurring, the exposure process may be performed twice on the boundary between the exposure areas. A mask pattern on the portion on which the exposure process is performed twice should be the same between a first exposure operation and a second exposure operation to prevent the stitch spots from occurring.

Taking into account the foregoing problems and improvement methods, residual areas RA (for example, RA1 and RA2) may be repeatedly formed in the second areas A2-1, A2-2, and A2-3. Planar shapes of the bottom metal layers BML in the residual areas RA of the second areas A2-1, A2-2, and A2-3 may be substantially the same. For example, the residual areas RA may be arranged in the first direction in the second areas A2-1, A2-2, and A2-3.

Furthermore, the number of residual areas RA in each of the first, second, and third pixel blocks BL1, BL2, and BL3 may be the same. Although FIG. 12 illustrates that each of the first, second, and third pixel blocks BL1, BL2, and BL3 includes four residual areas RA, the number of residual areas RA included in each of the pixel blocks BL is not limited thereto. For example, depending on the size of the pixel component 100, the size of the mask, and other image quality factors, two or more residual areas RA may be included in each of the pixel blocks BL. The number of pixel blocks BL may be increased to four or more.

The residual area RA may include the disconnected portion DCP formed by the mask. The residual area RA may occupy a portion of each of the second areas A2-1, A2-2, and A2-3.

The sub-scan lines SSL, the first vertical power lines V_PL1 of the first power line PL1, the second power lines PL2, the dummy lines DML, the data lines DL, and the supplementary power lines SP_PL may be disposed in the residual area RA. The bottom metal layer BML in each of the residual areas RA may include the sub-scan lines SSL, the first vertical power lines V_PL1 of the first power line PL1, the second power lines PL2, the dummy lines DML, the data lines DL, and the supplementary power lines SP_PL.

In an embodiment, the residual area RA may include disconnected portions DCP between the sub-scan lines SSL and the supplementary power lines SP_PL. The disconnected portion DCP may correspond to each pixel column. Therefore, each disconnected portion DCP may correspond to ends of the first sub-scan line SSL1 and the second sub-scan line SSL2 that are adjacent to each other, and ends of a first supplementary power line SP_PL1 and a second supplementary power line SP_PL1 that are adjacent to each other. For example, the sub-scan liens SSL and the supplementary power line SP_PL that are adjacent to each other in the second direction DR2 may be separated from each other by the disconnected portion DCP.

The residual area RA may be defined according to the arrangement of the disconnected portions DCP. In an embodiment, in the residual area RA, the disconnected portions DCP may be arranged in a diagonal direction with respect to the first direction DR1. For example, in the residual area RA, the lengths of the supplementary power lines SP_PL in the second direction DR2 may decrease in the first direction DR1. Likewise, the lengths of the sub-scan lines SSL in each residual area RA in the second direction DR2 may increase in the first direction DR1.

The disconnected portions DCP may not be located in the dummy area DMA in which the dummy lines DML are disposed.

In an embodiment, the supplementary power lines SP_PL may be connected to the second power line PL2 adjacent thereto in the residual area RA. Therefore, the IR drop of the second power supply VSS may be reduced, and a luminance deviation may be mitigated.

In an embodiment, the supplementary power lines SP_PL may be connected to the first vertical power line V_PL1 adjacent thereto in the residual area RA. Therefore, the IR drop of the first power supply VSS may be reduced, and power consumption may be reduced and a luminance deviation may be mitigated.

Figure 14:
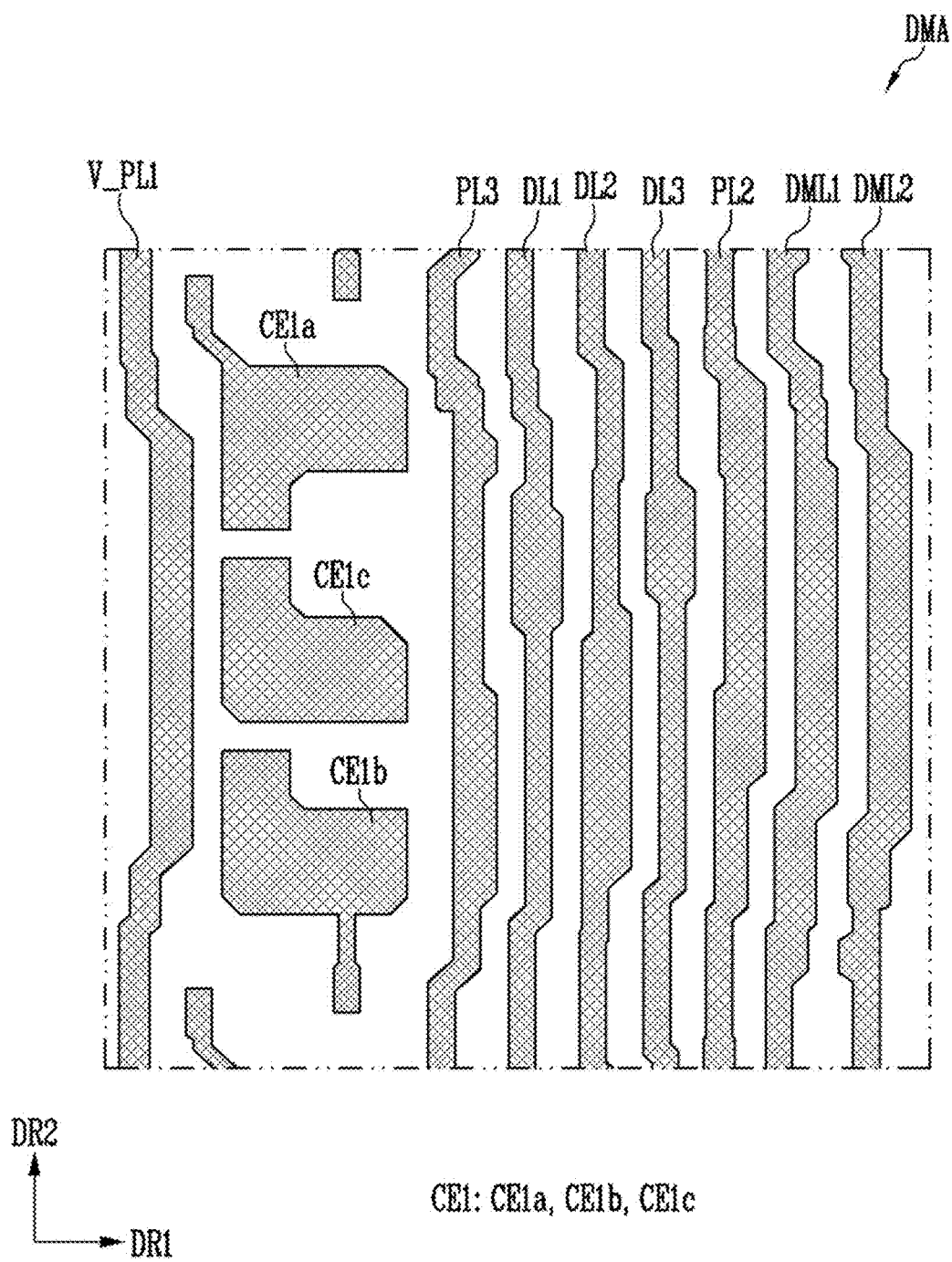
FIG. 14 is a schematic plan view illustrating a bottom metal layer disposed in a dummy line area of FIG. 13 in accordance with embodiments of the disclosure.

FIG. 14 is a schematic plan view illustrating a bottom metal layer disposed in the dummy line area DMA of FIG. 13 in accordance with embodiments of the disclosure.

FIG. 14 illustrates an area corresponding to a pixel PX in the dummy line area DMA in accordance with embodiments of the disclosure.

Referring to FIGS. 11, 12, 13, and 14, the bottom metal layer BML in the dummy line area DMA may include the first vertical power line V_PL1, the first capacitor electrode CE1, the third power line PL3, the first data line DL1, the second data line DL2, the third data line DL3, the second power line PL2, the first dummy line DML1, and the second dummy line DML2.

The first capacitor electrode CE1 may include a first capacitor electrode CE1a included in the first pixel circuit PXC1, a first capacitor electrode CE1b included in the second pixel circuit PXC2, and a first capacitor electrode CE1c included in the third pixel circuit PXC3. The first capacitor electrodes CE1a, CE1b, and CE1c may be disposed at positions spaced apart from each other in the second direction DR2.

In an embodiment, the first vertical power line V_PL1, the second power line PL2, the third power line PL3, the first data line DL1, the second data line DL2, the third data line DL3, the first dummy line DML1, and the second dummy line DML2 may extend in the second direction over multiple pixel rows. For example, the first vertical power line V_PL1, the second power line PL2, the third power line PL3, the first data line DL1, the second data line DL2, the third data line DL3, the first dummy line DML1, and the second dummy line DML2 may extend in the second direction in the pixel component 100 without being disconnected.

As such, in the dummy line area DMA, the first dummy line DML1 and the second dummy line DML2 rather than the sub-scan lines SSL may be disposed on each of the pixel columns.

Figure 15:
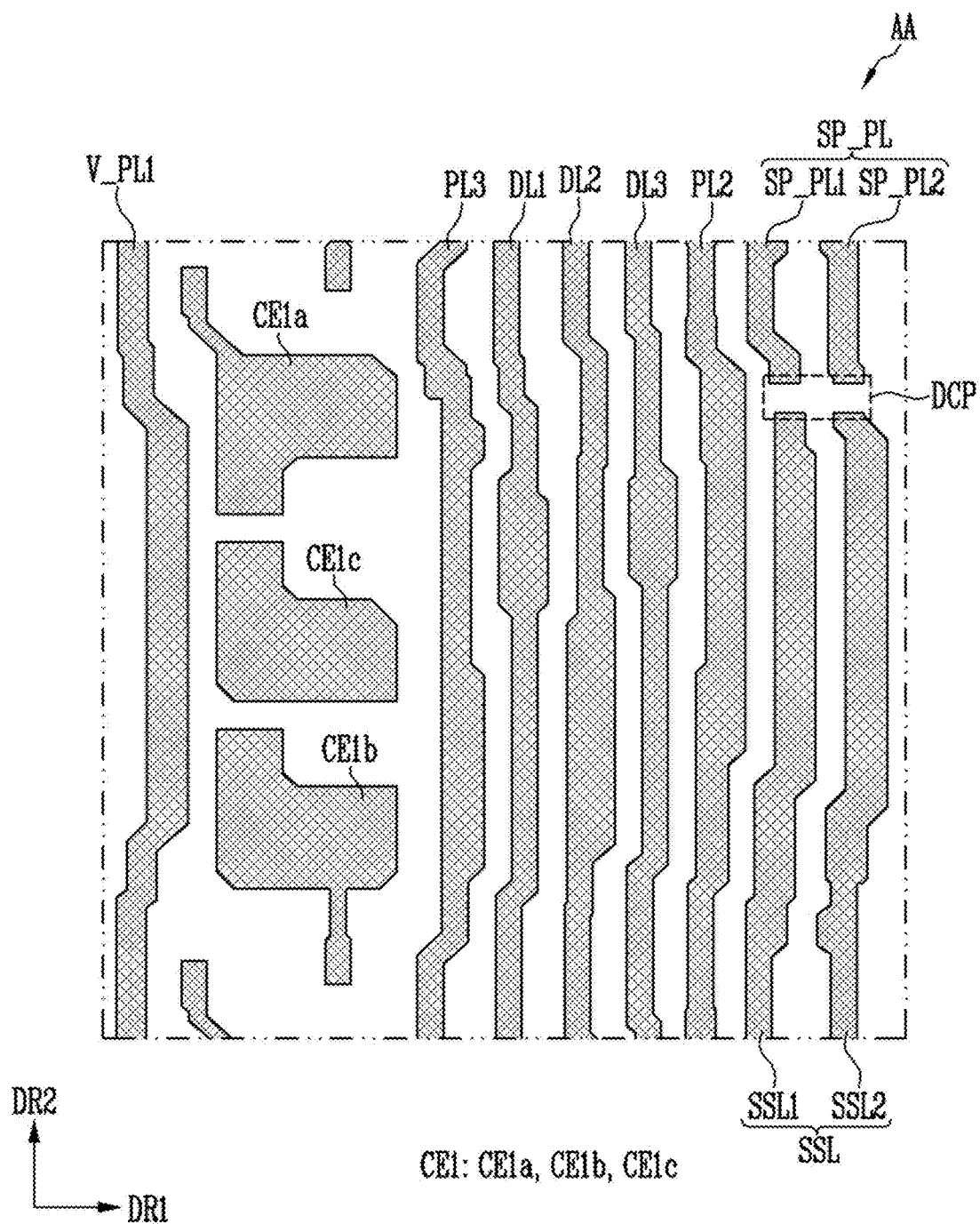
FIG. 15 is a schematic plan view illustrating the bottom metal layer disposed in area AA of FIG. 13 in accordance with embodiments of the disclosure.

FIG. 15 is a schematic plan view illustrating the bottom metal layer BML disposed in area AA of FIG. 13 in accordance with embodiments of the disclosure.

FIG. 15 illustrates an area corresponding to a pixel PX in the residual area RA in accordance with embodiments of the disclosure.

Referring to FIGS. 11, 12, 13, and 15, the bottom metal layer BML in area AA of the residual area RA may include the first vertical power line V_PL1, the first capacitor electrode CE1, the third power line PL3, the first data line DL1, the second data line DL2, the third data line DL3, the second power line PL2, the first sub-scan line SSL1, the second sub-scan line SSL2, the first supplementary power line SP_PL1, and the second supplementary power line SP_PL2.

In the disconnected portion DCP, the first sub-scan line SSL1 and the first supplementary power line SP_PL1 may be spaced apart from each other in the second direction DR2. In the disconnected portion DCP, the second sub-scan line SSL2 and the second supplementary power line SP_PL2 may be spaced apart from each other in the second direction DR2.

In an embodiment, the disconnected portion DCP may be formed through a patterning (or etching) process using a mask exposure operation described above. Hence, as the lengths of the sub-scan lines SSL are reduced, the IR drop of the scan signal in the display device having a single side driving structure may be reduced.

Figure 16:
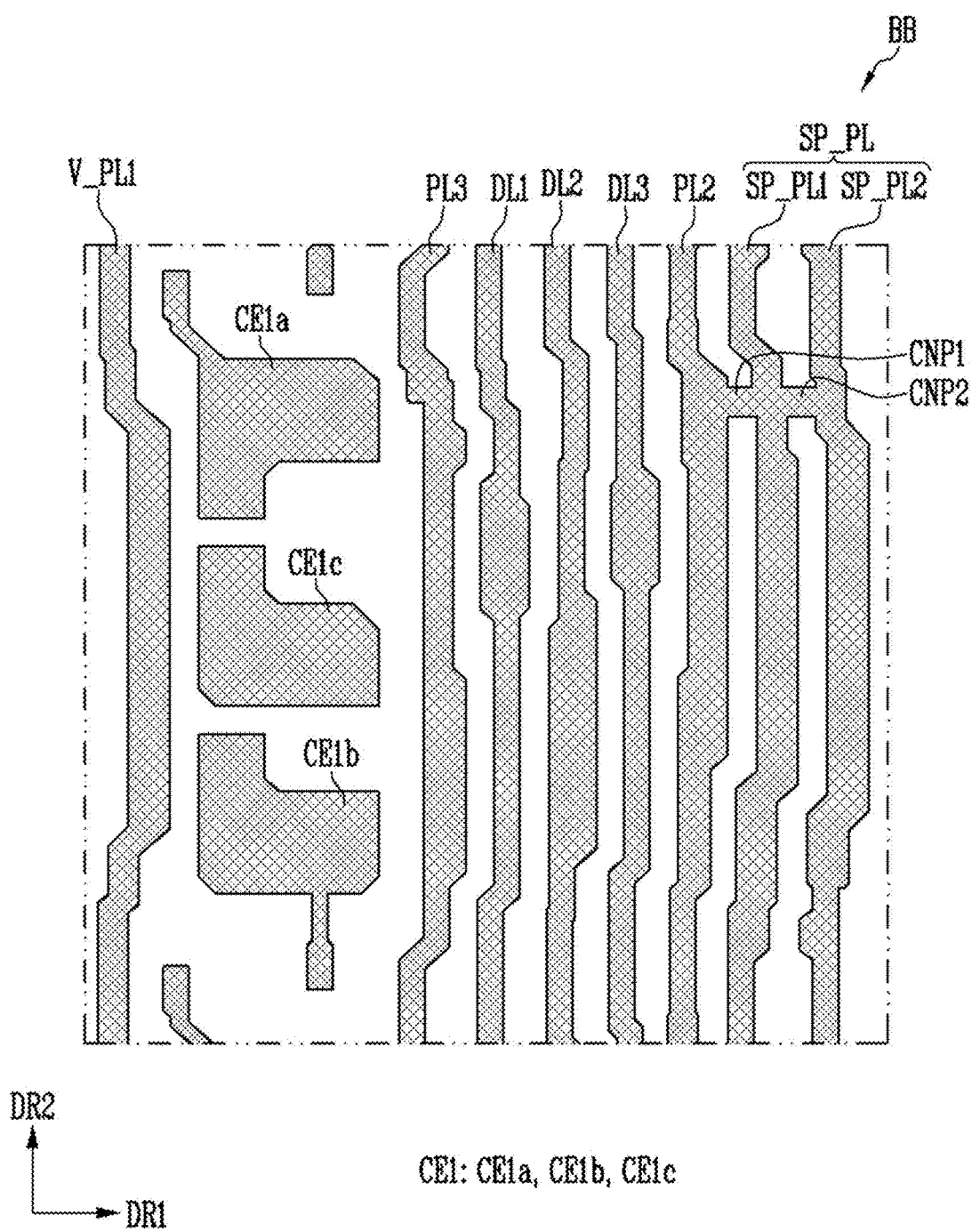
FIG. 16 is a schematic plan view illustrating the bottom metal layer disposed in area BB of FIG. 13 in accordance with embodiments of the disclosure.

FIG. 16 is a schematic plan view illustrating the bottom metal layer BML disposed in area BB of FIG. 13 in accordance with embodiments of the disclosure.

FIG. 16 illustrates an area corresponding to a pixel PX in the residual area RA in accordance with embodiments of the disclosure.

Referring to FIGS. 11, 12, 13, and 16, the bottom metal layer BML in area AA of the residual area RA may include the first vertical power line V_PL1, the first capacitor electrode CE1, the third power line PL3, the first data line DL1, the second data line DL2, the third data line DL3, the second power line PL2, the first supplementary power line SP_PL1, and the second supplementary power line SP_PL2.

Area BB may be located in an area spaced apart from area AA in the second direction DR2. Therefore, the first supplementary power line SP_PL1 and the second supplementary power line SP_PL2 may be signal lines extending from area AA.

In an embodiment, the first supplementary power line SP_PL1 and the second supplementary power line SP_PL2 may be connected to each other by a second connector CNP2. In an embodiment, the first supplementary power line SP_PL1 may be connected to the adjacent second power line PL2 by a first connector CNP1. Hence, the second power line PL2, the first supplementary power line SP_PL1, and the second supplementary power line SP_PL2 may be electrically connected to each other. Therefore, the IR drop of the second power supply VSS to be supplied to the second power line PL2 may be reduced, and the image quality (e.g., the luminance uniformity) of the display device 1000 having a single side driving structure can be improved.

In an embodiment, the pattern of the bottom metal layer BML including the first connector CNP1 and the second connector CNP2 may be formed using a mask in the residual area RA.

Figure 17:
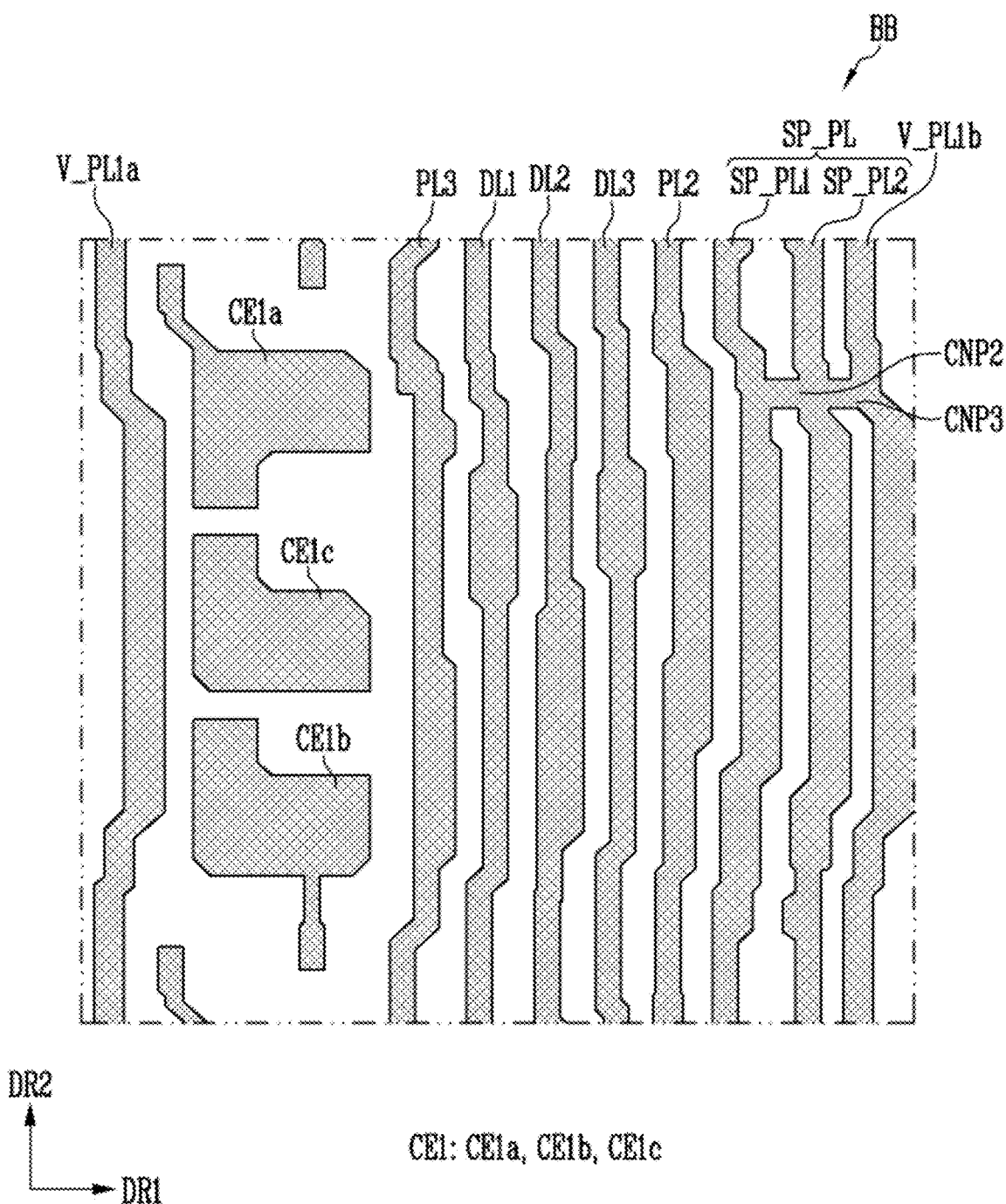
FIG. 17 is a schematic plan view illustrating the bottom metal layer disposed in area BB of FIG. 13 in accordance with embodiments of the disclosure.

FIG. 17 is a schematic plan view illustrating the bottom metal layer BML disposed in area BB of FIG. 13 in accordance with embodiments of the disclosure.

In the description of FIG. 17, like references will be used to designate components identical or similar to those described with reference to FIG. 16, and redundant explanation thereof will be omitted. The bottom metal layer BML of FIG. 17, other than a connection relationship between the supplementary lines SP_PL and the power line, may be substantially identical or similar to the bottom metal layer BML of FIG. 16.

FIG. 17 illustrates an area corresponding to a pixel PX in the residual area RA in accordance with embodiments of the disclosure.

Referring to FIGS. 11, 12, 13, and 17, the bottom metal layer BML in area BB of the residual area RA may include a second vertical power line V_PL1a, a third vertical power line V_PL1b, the first capacitor electrode CE1, the third power line PL3, the first data line DL1, the second data line DL2, the third data line DL3, the second power line PL2, the first supplementary power line SP_PL1, and the second supplementary power line SP_PL2.

In an embodiment, the first supplementary power line SP_PL1 and the second supplementary power line SP_PL2 may be connected to each other by a second connector CNP2. In an embodiment, the second supplementary power line SP_PL2 may be connected to the adjacent third vertical power line V_PL1b by a third connector CNP3. The third vertical power line V_PL1b may be a signal line for supplying the voltage of the first power supply VDD to a pixel adjacent to the right side of the pixel corresponding to the signal lines of FIG. 17.

Hence, the third vertical power line V_PL1b, the first supplementary power line SP_PL1, and the second supplementary power line SP_PL2 may be electrically connected to each other. Therefore, the IR drop of the first power supply VDD to be supplied to the first power line PL1, and the power consumption may be reduced. The image quality (e.g., the luminance uniformity) of the display device 1000 having a single side driving structure may be improved.

In an embodiment, the pattern of the bottom metal layer BML including the second connector CNP2 and the third connector CNP3 may be formed using a mask in the residual area RA.

As described above, the display device 1000 having a single side driving structure in accordance with an embodiment of the disclosure may include the pattern of the bottom metal layer BML in the residual areas RA which are repeatedly arranged in the second area of each of the pixel blocks BL. Therefore, the lengths of unnecessary portions of the sub-scan lines SSL may be reduced, so that the IR drop of a scan signal may be mitigated. Furthermore, residual lines separated from each other by the disconnected portion DCP may be connected to the first power line PL1 or the second power line PL2 as the supplementary power lines SP_PL, so that the IR drop of the power voltage may be mitigated, the power consumption may be reduced, and the image quality, which is affected by factors such as a luminance deviation, may be improved.

FIGS. 18A, 18B, 19A, 19B, 20A, and 20B are schematic diagrams for describing a method of fabricating a display device in accordance with embodiments of the disclosure.

Referring to FIGS. 1, 11, 18A, 18B, 19A, 19B, 20A, and 20B, the method of fabricating the display device may include patterning a first exposure area of the bottom metal layer BML on the substrate using a portion of a mask MASK including residual area patterns RAP, patterning a second exposure area of the bottom metal layer BML using another portion of the mask MASK, and patterning a third exposure area of the bottom metal layer BML using another portion of the mask MASK.

The mask MASK may include a pattern in which the residual area patterns RAP are repeated (or arranged) in a direction. Although not illustrated for convenience of explanation, the mask MASK may have a pattern for forming the first vertical power line V_PL1, the first capacitor electrode CE1, the second power line PL2, the third power line PL3, the data lines DL, the dummy lines DML, the sub-scan lines SSL, and the supplementary power lines SP_PL, which are illustrated in FIGS. 14 to 17. For example, the dummy lines DML may be formed in the dummy line area DMA of the pixel component 100 through an exposure process using the mask MASK.

Figure 18A:
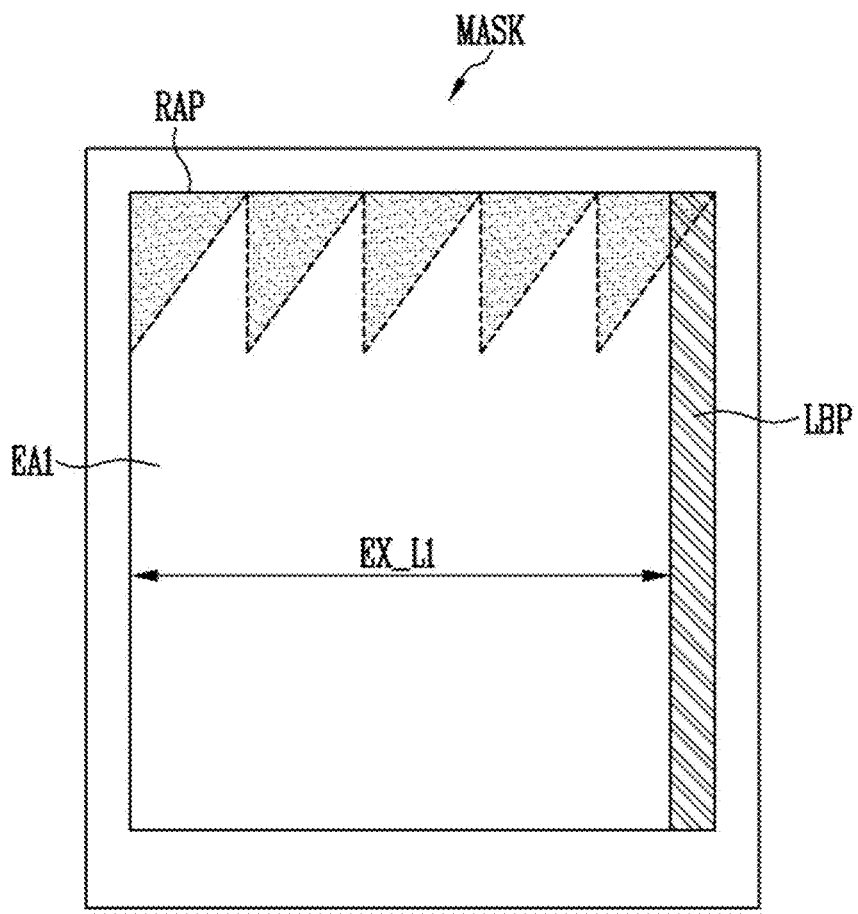
Figure 18B:
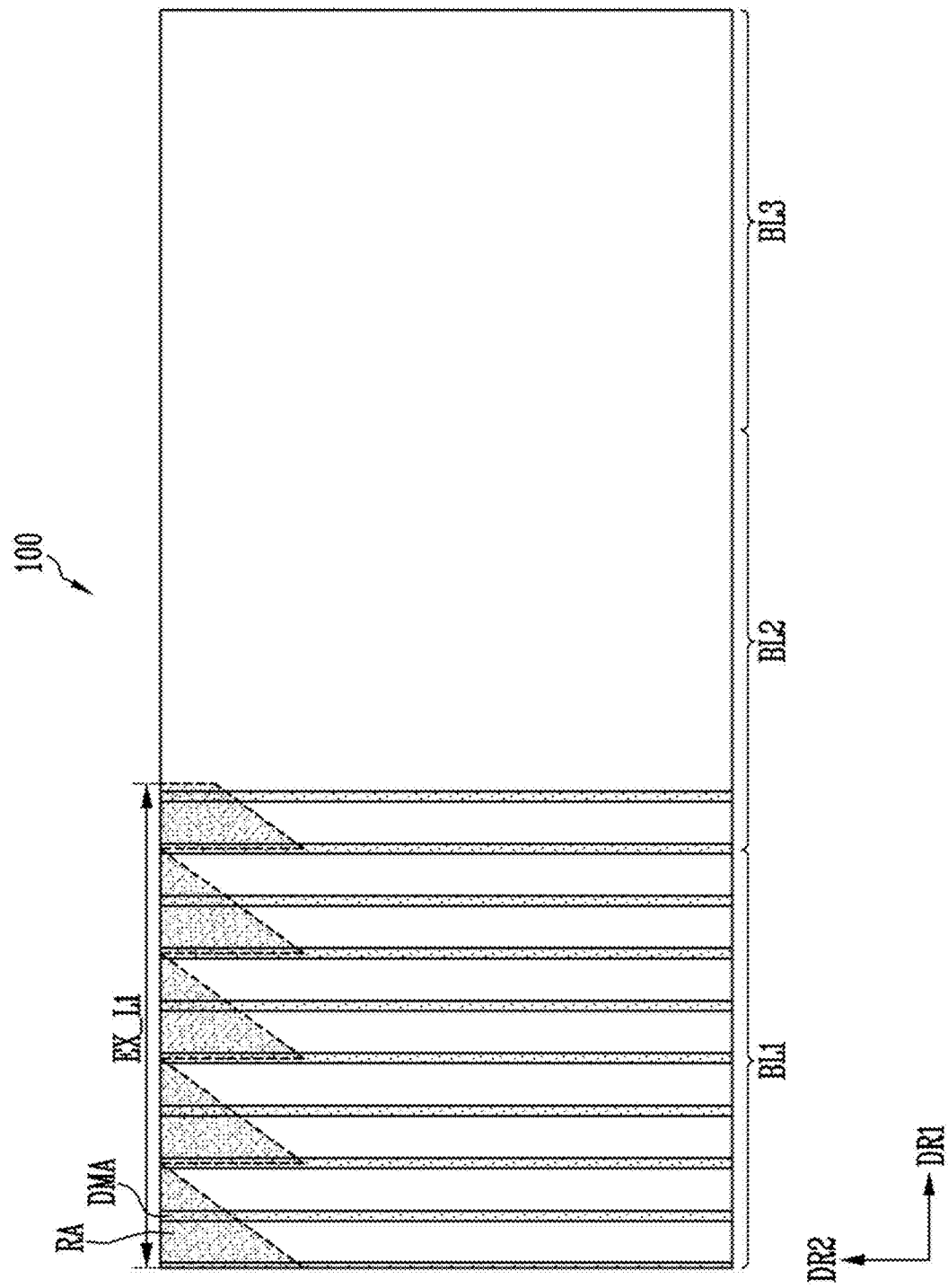

As illustrated in FIG. 18A, only a portion of the mask MASK corresponding to a first exposure area EA1 may be used in a first exposure process (patterning process) for the bottom metal layer BML. For example, the first exposure area EA1 may have a first length EX_L1 in a pixel row direction. A right side portion of the mask MASK may be covered with a light blocking component LBP. As illustrated in FIG. 18B, the bottom metal layer BML of an area (e.g., the first exposure area EA1) corresponding to the first length EX_L1 of the pixel component 100 may be patterned. The residual area RA may be formed to correspond to the residual area pattern RAP.

Each of rectangular areas including the residual area RA and an area extending from the residual area RA in a direction opposite to the second direction DR2 may include a pattern of the bottom metal layer BML having substantially the same shape.

The pattern of the bottom metal layer BML formed through the first exposure process may be formed beyond the first pixel block BL1.

Figure 19A:
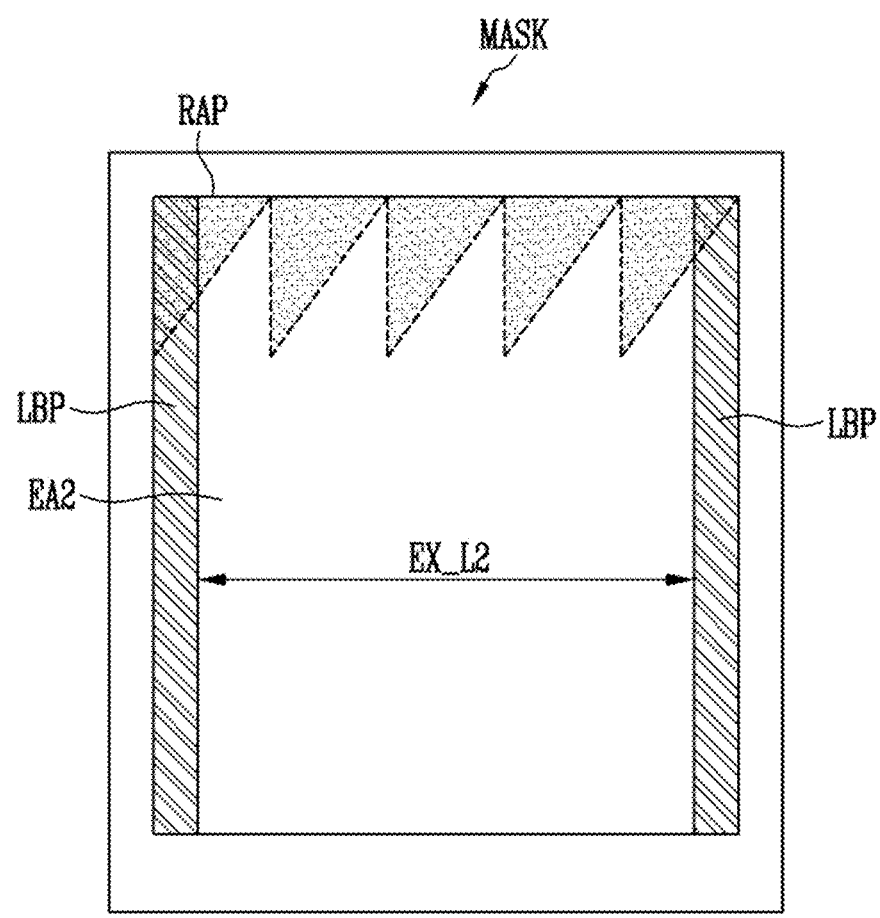

As illustrated in FIG. 19A, only another portion of the mask MASK corresponding to a second exposure area EA2 may be used in a second exposure process (patterning process) for the bottom metal layer BML. For example, the second exposure area EA2 may have a second length EX_L2 in a pixel row direction. Left and right side portions of the mask MASK may be covered with a light blocking component LBP.

The second length EX_L2 may be less than the first length EX_L1.

Figure 19B:
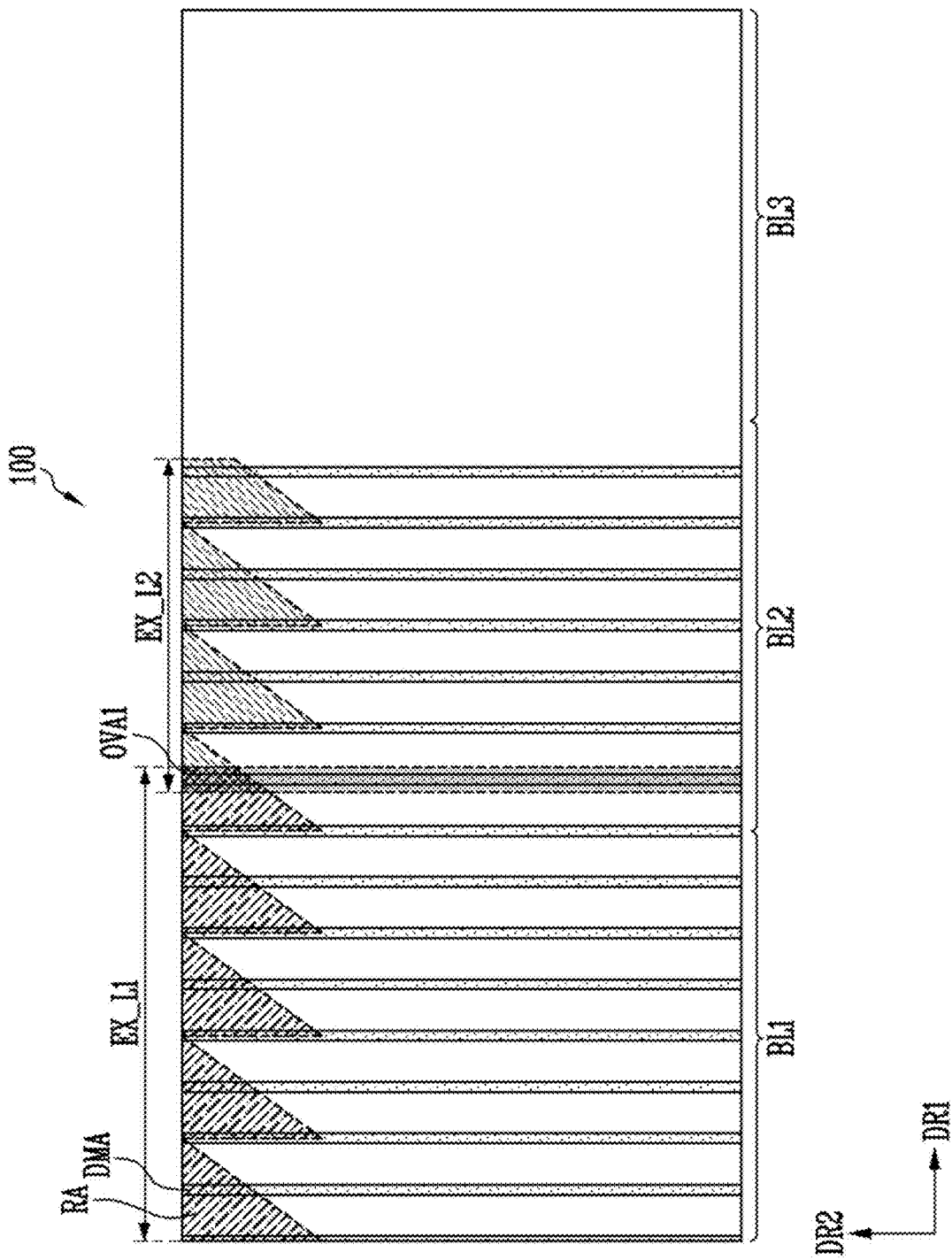

As illustrated in FIG. 19B, the bottom metal layer BML of an area (e.g., the second exposure area EA2) corresponding to the second length EX_L2 of the pixel component 100 may be patterned. In an embodiment, the first exposure process and the second exposure process may be performed such that an area on which the first exposure process is performed and an area on which the second exposure process is performed overlap each other in a portion of the pixel component 100 so as to prevent a stitch spot defect of the bottom metal layer BML. Therefore, a first overlap area OVA1 may be defined in the pixel component.

During the first exposure process and the second exposure process, the first overlap area OVA1 may be patterned with a same pattern. For example, the pattern formed in the first overlap area OVA1 during the first exposure process and the pattern formed in the first overlap area OVA1 during the second exposure process may be substantially the same. Therefore, the stitch spot may be prevented from occurring, and the pattern of the bottom metal layer BML described with reference to FIGS. 13 to 17 may be formed.

In an embodiment, the length of the first overlap area OVA1 in the first direction DR1 may be approximately 100 mm.

Figure 20A:
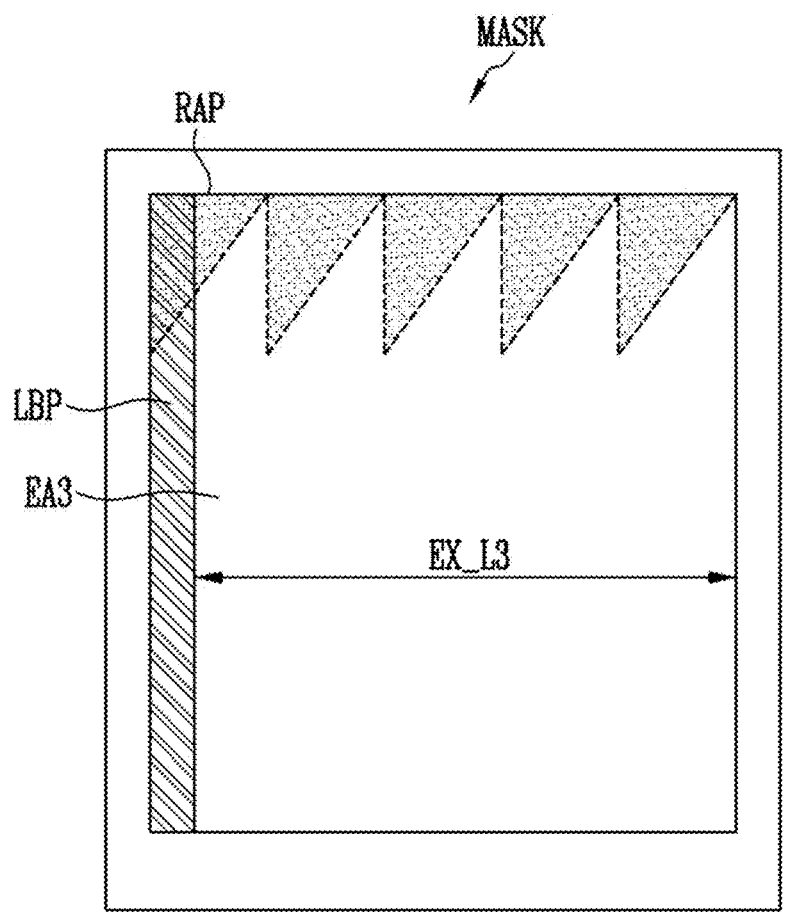

As illustrated in FIG. 20A, only another portion of the mask MASK corresponding to a third exposure area EA3 may be used in a third exposure process (patterning process) for the bottom metal layer BML. For example, the third exposure area EA3 may have a third length EX_L3 in the pixel row direction. A left side portion of the mask MASK may be covered with a light blocking component LBP.

The second length EX_L2 may be less than the third length EX_L3. In an embodiment, the third length EX_L3 and the first length EX_L1 may be substantially the same.

Therefore, as illustrated in FIG. 20B, the bottom metal layer BML of an area (e.g., the third exposure area EA3) corresponding to the third length EX_L3 of the pixel component 100 may be patterned. In an embodiment, the third exposure process may be performed such that an area on which the third exposure process is performed overlaps a portion of the area on which the second exposure process is performed, so as to prevent a stitch spot defect of the bottom metal layer BML. Therefore, a second overlap area OVA2 may be defined in the pixel component.

During the second exposure process and the third exposure process, the second overlap area OVA2 may be patterned with a same pattern. For example, the pattern formed in the second overlap area OVA2 during the second exposure process and the pattern formed in the second overlap area OVA2 during the third exposure process may be substantially the same. Therefore, the stitch spot may be prevented from occurring, and the pattern of the bottom metal layer BML described with reference to FIGS. 13 to 17 may be formed.

In an embodiment, the surface area and the pattern of the second overlap area OVA2 and the first overlap area OVA1 may be substantially the same. However, the disclosure is not limited thereto, and at least one of the surface area and the pattern of the second overlap area OVA2 may be different from that of the first overlap area OVA1. Although FIGS. 19B and 20B illustrate that the dummy area DMA is included in the first and second overlap areas OVA1 and OVA2, the disclosure is not limited thereto. The dummy line area DMA may not be disposed in the first and second overlap areas OVA1 and OVA2, depending on the size of the mask MASK, the size of the pixel component 100, and the numbers and sizes of pixel blocks BL1, BL2, and BL3.

Thereafter, the gate layer GML and an insulating layer may be successively formed on the bottom metal layer BML. The contacts CPa, CPb, and CPc may be formed by etching the insulating layer. The top metal layer SDL may be patterned on the insulating layer. Hence, as illustrated in FIG. 11, the pixel circuit layer PCL of the display device may be formed.

The structure of the pixel circuit layer PCL formed by the method of fabricating the display device in accordance with an embodiment of the disclosure has been described in detail with reference to FIGS. 1 to 17; therefore redundant explanation thereof will be omitted.

As described above, the display device and the method of fabricating the display device in accordance with an embodiment of the disclosure may include the pattern of the bottom metal layer BML of the residual areas RA which are repeatedly arranged in the second area of each of the pixel blocks BL. Therefore, the lengths of unnecessary portions of the sub-scan lines SSL may be reduced, so that the IR drop of a scan signal may be mitigated. Furthermore, residual lines separated from each other by the disconnected portion DCP may be connected to the first power line PL1 or the second power line PL2 as the supplementary power lines SP_PL, so that the IR drop of the power voltage may be mitigated, the power consumption may be reduced, and the image quality, which is affected by factors such as a luminance deviation, may be improved.

A patterning operation for the bottom metal layer BML may be performed with the overlap areas OVA1 and OVA2 such that multiple residual areas RA having the same pattern may be formed in each of the pixel blocks BL1, BL2, and BL3, whereby the number of times exposure operations are performed may be minimized. Therefore, stitch spots may be minimized or prevented from occurring.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
    a pixel component including scan lines extending in a first direction, data lines extending in a second direction, and pixels electrically connected to the scan lines and the data lines, and defining pixel columns and pixel rows;
    a data driver disposed on a side of the pixel component and electrically connected to the data lines; and
    a scan driver disposed on the side of the pixel component and electrically connected to the scan lines, wherein
    the pixel component comprises:
        sub-scan lines extending from the scan driver in the second direction; and
        dummy lines extending in the second direction,
    each of the scan lines is electrically connected to the sub-scan lines in a ratio of 1:n (where n is an integer greater than 1) by contacts,
    the contacts are divided into contact groups, the contacts in each of the contact groups arranged colinearly in a diagonal direction with respect to the first direction,
    the pixel component is divided into pixel blocks corresponding to respective contact groups,
    each of the pixel blocks includes a first area and a second area divided by a corresponding one of the contact groups,
    in a pixel column, the first area is closer to the scan driver than the second area,
    the pixel component further includes, in the second area, supplementary power lines spaced apart from a corresponding one of the sub-scan lines in the second direction,
    the second area includes residual areas having an identical arrangement structure of the sub-scan lines, the dummy lines, the data lines, and the supplementary power lines, and
    the residual areas are arranged in the first direction.

2. The display device according to claim 1, wherein the pixel component further comprises:
    first power lines providing a voltage of a first power supply to the pixels, and extending in the second direction; and
    second power lines providing a voltage of a second power supply to the pixels, and extending in the second direction, and
    the first power lines and the second power lines are spaced apart from the sub-scan lines and the dummy lines in the first direction.

3. The display device according to claim 2, wherein two adjacent ones of the supplementary power lines are electrically connected to each other in the second area.

4. The display device according to claim 3, wherein the two supplementary power lines electrically connected to each other are electrically connected to an adjacent one of the first power lines in the second area.

5. The display device according to claim 3, wherein the two supplementary power lines electrically connected to each other are electrically connected to an adjacent one of the second power lines in the second area.

6. The display device according to claim 2, wherein the residual areas have an identical arrangement structure of the first power lines and the second power lines.

7. The display device according to claim 6, wherein a number of the residual areas in each of the pixel blocks is same.

8. The display device according to claim 6, wherein
each of the residual areas includes disconnected portions disposed between the sub-scan lines and the supplementary power lines, and
the disconnected portions are arranged in the diagonal direction.

9. The display device according to claim 8, wherein, in each of the residual areas, lengths of the supplementary power lines in the second direction decrease in the first direction.

10. The display device according to claim 8, wherein
some of the pixel columns overlap the dummy lines in a plan view, and
rest of the pixel columns overlap the sub-scan lines in a plan view.

11. The display device according to claim 10, wherein
the pixel columns include a first pixel column and a second pixel column,
the first pixel column overlaps two dummy lines adjacent to each other in a plan view, and
the second pixel column overlaps two sub-scan lines adjacent to each other in a plan view.

12. The display device according to claim 11, wherein
the scan lines include a first scan line and a second scan line adjacent to each other,
one of the two sub-scan lines adjacent to each other is electrically connected to the first scan line, and
another one of the two sub-scan lines adjacent to each other is electrically connected to the second scan line.

13. The display device according to claim 6, wherein the sub-scan lines, the first power lines, the second power lines, the dummy lines, the data lines, and the supplementary power lines are disposed on a same layer.

* * * * *